United States Patent
Komoto et al.

(10) Patent No.: US 11,252,510 B2
(45) Date of Patent: Feb. 15, 2022

(54) PIEZOELECTRIC SPEAKER-FORMING LAMINATE

(71) Applicant: NITTO DENKO CORPORATION, Ibaraki (JP)

(72) Inventors: Yusuke Komoto, Osaka (JP); Tomoaki Hishiki, Osaka (JP); Kohei Oto, Osaka (JP); Saori Yamamoto, Osaka (JP); Yuka Sekiguchi, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 113 days.

(21) Appl. No.: 16/764,757

(22) PCT Filed: Nov. 20, 2018

(86) PCT No.: PCT/JP2018/042907
§ 371 (c)(1),
(2) Date: May 15, 2020

(87) PCT Pub. No.: WO2019/103015
PCT Pub. Date: May 31, 2019

(65) Prior Publication Data
US 2021/0029468 A1 Jan. 28, 2021

(30) Foreign Application Priority Data

Nov. 21, 2017 (JP) .............................. JP2017-223793

(51) Int. Cl.
*H04R 17/00* (2006.01)
*H01L 41/09* (2006.01)

(52) U.S. Cl.
CPC ......... *H04R 17/00* (2013.01); *H01L 41/0926* (2013.01)

(58) Field of Classification Search
CPC ......... H04R 17/00; H04R 17/10; H04B 11/00
See application file for complete search history.

(56) References Cited

U.S. PATENT DOCUMENTS 10,511,389 B2 * 12/2019 Kijima ................... H04R 17/00
2010/0038998 A1 2/2010 Onishi et al.
(Continued)

FOREIGN PATENT DOCUMENTS

CN 103428621 12/2013
EP 0 732 864 9/1996
(Continued)

OTHER PUBLICATIONS

International Search Report and Written Opinion issued in International Application No. PCT/JP2018/042907, dated Feb. 12, 2019, 9 pages.

(Continued)

*Primary Examiner* — Amir H Etesam
(74) *Attorney, Agent, or Firm* — Hamre, Schumann, Mueller & Larson, P.C.

(57) ABSTRACT

A piezoelectric speaker-forming laminate (10) includes: a piezoelectric film (35); a pressure-sensitive adhesive face (17); an interposed layer (40) being a porous body layer and/or a resin layer disposed between the piezoelectric film (35) and the pressure-sensitive adhesive face (17); and a release layer (20) joined to the pressure-sensitive adhesive face (17). The pressure-sensitive adhesive face (17) is disposed in such a manner that at least a portion of the piezoelectric film (35) overlaps the pressure-sensitive adhesive face (17) when the piezoelectric film (35) is viewed in plan. The piezoelectric film (35) and the interposed layer (40) are allowed to be fixed to a support (80) as a piezoelectric speaker or a portion of a piezoelectric speaker by sticking the pressure-sensitive adhesive face (17) from which the release layer (20) has been removed to the support (80).

9 Claims, 19 Drawing Sheets

(56) References Cited

U.S. PATENT DOCUMENTS

2013/0259274 A1 10/2013 Hayashi et al.
2017/0041082 A1 2/2017 Kijima et al.

FOREIGN PATENT DOCUMENTS

| JP | 63-081599 U | 5/1988 |
| JP | 6-236189 | 8/1994 |
| JP | 8-265897 | 10/1996 |
| JP | 2010-226405 | 10/2010 |
| JP | 2016-122187 | 7/2016 |
| JP | 2017-034634 | 2/2017 |
| WO | 2013/046909 | 4/2013 |

OTHER PUBLICATIONS

Extended European Search Report issued for European Patent Application No. 18881904.9, dated Jul. 16, 2021, 9 pages.
Office Action issued for Chinese Patent Application No. 201880075032.4, dated Oct. 28, 2020, 12 pages including English machine translation.

* cited by examiner

| | Overall structure | Type of interposed layer | Thickness (mm) of interposed layer | Elastic modulus E (N/m²) of interposed layer | Structure of pores of interposed layer | Pore diameter (mm) of interposed layer | Porosity of interposed layer | Surface filling factor of interposed layer | Holding degree (N/m³) | Frequency (Hz) at which emission of sound starts |
|---|---|---|---|---|---|---|---|---|---|---|
| Reference Example 1 | Electrodes / PVDF | – | – | – | – | – | – | – | 0 | 3,500 |
| Example 1 | | Foam | 3 | 9.4E+04 | Closed-cell | 0.5 | 0.90 | 1.00 | 3.12E+07 | 3,300 |
| Example 2 | Electrodes / PVDF / PSA Sheet / Foam / PSA Sheet / Stainless steel plate | Foam | 3 | 6.5E+04 | Semi-open-/semi-closed-cell | 0.5 | 0.90 | 0.10 | 2.17E+06 | 2,400 |
| Example 3 | | Foam | 5 | 6.5E+04 | Semi-open-/semi-closed-cell | 0.5 | 0.90 | 0.10 | 1.30E+06 | 2,100 |
| Example 4 | | Foam | 10 | 6.5E+04 | Semi-open-/semi-closed-cell | 0.5 | 0.90 | 0.10 | 6.51E+05 | 1,400 |
| Example 5 | | Foam | 20 | 6.5E+04 | Semi-open-/semi-closed-cell | 0.5 | 0.90 | 0.10 | 3.25E+05 | 2,000 |
| Example 6 | | Foam | 20 | 2.1E+04 | Semi-open-/semi-closed-cell | 0.5 | 0.90 | 0.10 | 1.05E+05 | 3,000 |
| Example 7 | | Foam | 20 | 1.1E+04 | Semi-open-/semi-closed-cell | 0.5 | 0.95 | 0.05 | 2.83E+04 | 4,000 |
| Example 8 | Electrodes / PVDF / PSA Sheet / Porous metal body / PSA Sheet / Stainless steel plate | Porous metal body | 2 | 3.0E+06 | Open-cell | 0.9 | 0.95 | 0.05 | 7.62E+07 | 4,000 |
| Example 9 | Electrodes / PVDF / PSA Sheet / Stainless steel plate | Pressure-sensitive adhesive sheet | 3 | 2.5E+05 | Non-porous | – | 0.00 | 1.00 | 8.19E+07 | 4,000 |
| Example 10 | Electrodes / PVDF / PSA Sheet / PSA Sheet / PSA Sheet / Stainless steel plate | Pressure-sensitive adhesive sheet | 3 | 2.5E+05 | Non-porous | – | 0.00 | 1.00 | 8.19E+07 | 6,000 |
| Example 11 | Electrodes / PVDF / PSA Sheet | Urethane foam | 5 | 2.0E+04 | Open-cell | 1.5 | 0.96 | 0.04 | 1.46E+05 | 3,000 |
| Example 12 | Urethane foam / PSA Sheet / Stainless steel plate | Urethane foam | 10 | 1.6E+05 | Open-cell | 0.5 | 0.98 | 0.02 | 3.24E+05 | 2,500 |

※PSA:Pressure-sensitive adhesive

FIG.10A

| | Overall structure | Type of interposed layer | Thickness (mm) of interposed layer | Elastic modulus E (N/m²) of interposed layer | Structure of pores of interposed layer | Pore diameter (mm) of interposed layer | Porosity of interposed layer | Surface filling factor of interposed layer | Holding degree (N/m³) | Frequency (Hz) at which emission of sound starts |
|---|---|---|---|---|---|---|---|---|---|---|
| Example 13 | Electrodes / PVDF / PSA Sheet / Foam / PSA Sheet / Stainless steel plate | Foam | 5 | 1.1E+05 | Closed-cell | 0.4 | 0.88 | 0.12 | 2.82E+06 | 2,300 |
| Example 14 | Electrodes / PVDF / PSA Sheet / Foam / PSA Sheet / Stainless steel plate | Foam | 5 | 8.6E+04 | Closed-cell | 0.3 | 0.86 | 0.14 | 2.45E+06 | 2,400 |
| Example 15 | Electrodes / PVDF / PSA Sheet / Foam / PSA Sheet / Stainless steel plate | Foam | 5 | 1.2E+05 | Closed-cell | 0.3 | 0.79 | 0.21 | 5.17E+06 | 2,500 |
| Example 16 | Electrodes / PVDF / PSA Sheet / Foam / PSA Sheet / Stainless steel plate | Foam | 5 | 3.9E+04 | Closed-cell | 0.6 | 0.80 | 0.20 | 1.54E+06 | 1,800 |
| Example 17 | Electrodes / PLA / PSA Sheet / Foam / PSA Sheet / Stainless steel plate | Foam | 10 | 9.4E+04 | Closed-cell | 0.5 | 0.90 | 1.00 | 9.35E+06 | 2,200 |

※PSA:Pressure-sensitive adhesive

FIG.10B

PIEZOELECTRIC SPEAKER-FORMING LAMINATE

TECHNICAL FIELD

The present invention relates to a piezoelectric speaker-forming laminate. The present invention specifically relates to a piezoelectric speaker-forming laminate a portion of which is allowed to be fixed to a support as a piezoelectric speaker or a portion of a piezoelectric speaker by sticking a pressure-sensitive adhesive face from which the release layer has been removed to the support.

BACKGROUND ART

In recent years, a speaker employing a piezoelectric film (such a speaker may hereinafter be referred to as a piezoelectric speaker) is sometimes adopted as a speaker for audio equipment or for sound reduction. Piezoelectric speakers have an advantage in that they are small in volume and light.

Patent Literature 1 describes an example of a piezoelectric speaker. Specifically, Patent Literature 1 describes sticking a piezoelectric speaker to a wooden board serving as a support using an adhesive.

CITATION LIST

Patent Literature

Patent Literature 1: JP H06-236189 A
Patent Literature 2: JP 2016-122187 A

SUMMARY OF INVENTION

Technical Problem

It is conceivable that in order to stick a piezoelectric speaker to a support, a procedure is performed in which an adhesive is applied to the piezoelectric speaker or the support and then the piezoelectric speaker is stuck to the support with the adhesive therebetween. However, such a procedure is troublesome to a person who does the procedure.

Additionally, some supports to which a piezoelectric film is stuck can make it difficult to emit lower-frequency sound in the audible range.

The present invention aims to provide, by making these problems less severe or solving these problems, an article for forming a piezoelectric speaker that sticks, the article being convenient and having characteristics unlikely to be limited by a support.

Solution to Problem

The present invention provides a piezoelectric speaker-forming laminate including:
a piezoelectric film;
a pressure-sensitive adhesive face;
an interposed layer being a porous body layer and/or a resin layer disposed between the piezoelectric film and the pressure-sensitive adhesive face; and
a release layer joined to the pressure-sensitive adhesive face, wherein
the pressure-sensitive adhesive face is disposed in such a manner that at least a portion of the piezoelectric film overlaps the pressure-sensitive adhesive face when the piezoelectric film is viewed in plan, and the piezoelectric film and the interposed layer are allowed to be fixed to a support as a piezoelectric speaker or a portion of a piezoelectric speaker by sticking the pressure-sensitive adhesive face from which the release layer has been removed to the support.

Advantageous Effects of Invention

The above piezoelectric speaker-forming laminate is configured in such a manner that the piezoelectric film and the interposed layer are allowed to be fixed to a support as a piezoelectric speaker or a portion of a piezoelectric speaker by removing the release layer and sticking the pressure-sensitive adhesive face to the support. The procedure in which the pressure-sensitive adhesive face is removed and the pressure-sensitive adhesive face is stuck to a support is less troublesome to a person who does the procedure.

In the above piezoelectric speaker-forming laminate, the interposed layer is disposed between the piezoelectric film and the pressure-sensitive adhesive face. Thus, when the pressure-sensitive adhesive face is stuck to a support, the interposed layer is disposed between the piezoelectric film and the support. Additionally, the interposed layer is a porous body layer and/or a resin layer. Such disposition and quality of material of the interposed layer are suitable for preventing a support from making it difficult to emit lower-frequency sound in the audible range from the resulting piezoelectric speaker.

For the above reasons, the present invention can embody a concept of a piezoelectric speaker that sticks and can provide a piezoelectric speaker-forming laminate that is convenient and has characteristics unlikely to be limited by a support.

BRIEF DESCRIPTION OF DRAWINGS

FIG. 10A is a table showing the results of evaluation of samples.

FIG. 10B is a table showing the results of evaluation of samples.

DESCRIPTION OF EMBODIMENTS

Figure 1:
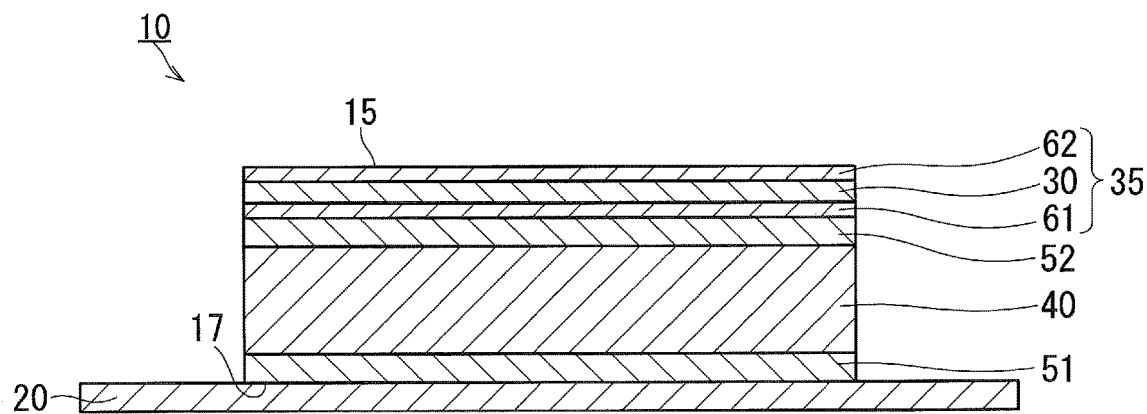
FIG. 1 is a cross-sectional view showing a piezoelectric speaker-forming laminate cut along the thickness direction thereof.

Hereinafter, embodiments of the present invention will be described with reference to the accompanying drawings. The following description is only illustrative of the embodiments of the present invention and has no intention to limit the present invention.

First Embodiment

A piezoelectric speaker-forming laminate according to a first embodiment will be described using FIG. 1 and FIG. 2. A piezoelectric speaker-forming laminate 10 includes a piezoelectric film 35, a pressure-sensitive adhesive face 17, an interposed layer 40, and a release layer 20. The laminate 10 also includes a pressure-sensitive adhesive layer 51, and the pressure-sensitive adhesive face 17 is formed of a surface (principal surface) of the pressure-sensitive adhesive layer 51. The laminate 10 further includes a pressure-sensitive adhesive or adhesive layer 52 (which may hereinafter be simply referred to as a pressure-sensitive adhesive layer 52). The piezoelectric film 35 includes a piezoelectric body 30, an electrode 61, and an electrode 62. The release layer 20, the pressure-sensitive adhesive layer 51, the interposed layer 40, the pressure-sensitive adhesive layer 52, and the piezoelectric film 35 are laminated in this order.

Hereinafter, the pressure-sensitive adhesive layer 51 may be referred to as a first pressure-sensitive adhesive layer 51, the pressure-sensitive adhesive layer 52 may be referred to as a second pressure-sensitive adhesive layer 52, the electrode 61 may be referred to as a first electrode 61, and the electrode 62 may be referred to as a second electrode 62.

The piezoelectric body 30 has the shape of a film. The piezoelectric body 30 is vibrated by application of voltage. A ceramic film, a resin film, and the like can be used as the piezoelectric body 30. Examples of the material of the piezoelectric body 30 that is a ceramic film include lead zirconate, lead zirconate titanate, lead lanthanum zirconate titanate, barium titanate, Bi-layered compounds, compounds having a tungsten bronze structure, and solid solutions of barium titanate and bismuth ferrite. Examples of the material of the piezoelectric body 30 that is a resin film include polyvinylidene fluoride and polylactic acid. The material of the piezoelectric body 30 that is a resin film may be a polyolefin such as polyethylene or polypropylene. The piezoelectric body 30 may be a non-porous body or may be a porous body.

The thickness of the piezoelectric body 30 is, for example, 10 μm to 300 μm and may be 30 μm to 110 μm.

The first electrode 61 and the second electrode 62 are in contact with the piezoelectric body 30 so as to sandwich the piezoelectric body 30. The first electrode 61 and the second electrode 62 each have the shape of a film. The first electrode 61 and the second electrode 62 are each connected to a lead wire which is not illustrated. The first electrode 61 and the second electrode 62 can be formed on the piezoelectric body 30 by vapor deposition, plating, sputtering, or the like. A metal foil can be used as each of the first electrode 61 and the second electrode 62. A metal foil can be stuck to the piezoelectric body 30 using a double-faced tape, a pressure-sensitive adhesive, an adhesive, or the like. Examples of the materials of the first electrode 61 and the second electrode 62 include metals, and specific examples thereof include gold, platinum, silver, copper, palladium, chromium, molybdenum, iron, tin, aluminum, and nickel. Examples of the materials of the first electrode 61 and the second electrode 62 also include carbon and electrically conductive polymers. Examples of the materials of the first electrode 61 and the second electrode 62 also include alloys of the above metals. The first electrode 61 and the second electrode 62 may include, for example, a glass component.

The thickness of the first electrode 61 and that of the second electrode 62 are each, for example, 10 nm to 150 μm, and may be 20 nm to 100 μm.

Figure 2:
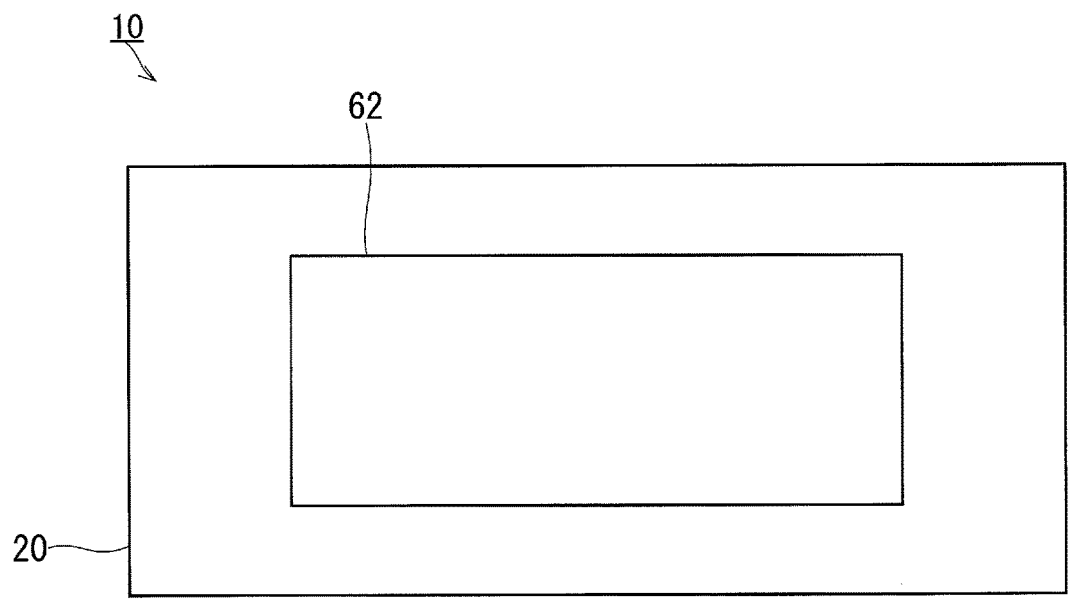
FIG. 2 is a top view showing a piezoelectric speaker-forming laminate viewed from the side opposite to a release layer.

In the example in FIG. 1 and FIG. 2, the first electrode 61 covers one entire principal surface of the piezoelectric body 30. The first electrode 61 may cover only a portion of the one principal surface of the piezoelectric body 30. The second electrode 62 covers the other entire principal surface of the piezoelectric body 30. The second electrode 62 may cover only a portion of the other principal surface of the piezoelectric body 30.

The interposed layer 40 is disposed between the piezoelectric film 35 and the pressure-sensitive adhesive face 17. In the present embodiment, the interposed layer 40 is disposed between the piezoelectric film 35 and the first pressure-sensitive adhesive layer 51. The interposed layer 40 may be a layer other than an adhesive layer and a pressure-sensitive adhesive layer, or may be an adhesive layer or a pressure-sensitive adhesive layer. The interposed layer 40 is a porous body layer and/or a resin layer. Here, the resin layer is a concept including a rubber layer and an elastomer layer. Therefore, the interposed layer 40 that is a resin layer may be a rubber layer or an elastomer layer. Examples of the interposed layer 40 that is a resin layer include an ethylene propylene rubber layer, a butyl rubber layer, a nitrile rubber layer, a natural rubber layer, a styrene-butadiene rubber layer, a silicone layer, a urethane layer, and an acrylic resin layer. Examples of the interposed layer 40 that is a porous body layer include foam layers. Specifically, examples of the interposed layer 40 that is a porous body layer and a resin layer include an ethylene propylene rubber foam layer, a butyl rubber foam layer, a nitrile rubber foam layer, a natural rubber foam layer, a styrene-butadiene rubber foam layer, a silicone foam layer, and a urethane foam layer. Examples of the interposed layer 40 that is not a porous body layer but a resin layer include acrylic resin layers. Examples of the interposed layer 40 that is not a resin layer but a porous body layer include porous metal body layers. The term "resin layer" as used herein refers to a resin-including layer. The term "resin layer" as used herein refers to a layer that may include a resin in an amount of 30% or more, in an amount of 45% or more, in an amount of 60% or more, or in an amount of 80% or more. The same applies to, for example, a rubber layer, an elastomer layer, an ethylene propylene rubber layer, a butyl rubber layer, a nitrile rubber layer, a natural rubber layer, a styrene-butadiene rubber layer, a silicone layer, an urethane layer, an acrylic resin layer, a metal layer, a resin film, and a ceramic film. The interposed layer 40 may be a blended layer including two or more materials.

The elastic modulus of the interposed layer 40 is, for example, 10000 N/m$^2$ to 20000000 N/m$^2$, and may be 20000 N/m$^2$ to 100000 N/m$^2$.

In an example, the pore diameter of the interposed layer 40 that is a porous body layer is 0.1 mm to 7.0 mm, and may be 0.3 mm to 5.0 mm. In another example, the pore diameter of the interposed layer 40 that is a porous body layer is, for example, 0.1 mm to 2.5 mm, and may be 0.2 mm to 1.5 mm or 0.3 mm to 0.7 mm. The porosity of the interposed layer 40 that is a porous body layer is, for example, 70% to 99%, and may be 80% to 99% or 90% to 95%.

A known foam (for example, the foam used in Patent Literature 2) can be used as the interposed layer 40 that is a foam layer. The interposed layer 40 that is a foam layer may have an open-cell structure, a closed-cell structure, or a semi-open-/semi-closed-cell structure. The term "open-cell structure" refers to a structure having an open cell rate of 100%. The term "closed-cell structure" refers to a structure having an open cell rate of 0%. The term "semi-open-/semi-closed-cell structure" refers to a structure having an open cell rate of greater than 0% and less than 100%. The open cell rate can be calculated, for example, using the following equation after a test in which a foam layer is sunk in water: open cell rate (%)={(volume of absorbed water)/(volume of cell part)}×100. In a specific example, the "volume of absorbed water" can be obtained by sinking and leaving a foam layer in water under a reduced pressure of −750 mmHg for 3 minutes, measuring the mass of water having replaced the air in cells of the foam layer, and converting the mass of water in the cells into volume on the assumption that the density of water is 1.0 g/cm$^3$. The term "volume of cell part" refers to a value calculated using the following equation: volume of cell part (cm$^3$)={(mass of foam layer)/(apparent density of foam layer)}−{(mass of foam layer)/(density of material)}. The term "density of material" refers to the density of a matrix (solid, or non-hollow, body) forming the foam layer.

The foaming factor (the ratio between the density before foaming and that after foaming) of the interposed layer 40 that is a foam layer is, for example, 5 to 40, and may be 10 to 40.

The interposed layer 40 in an uncompressed state has a thickness of, for example, 0.1 mm to 30 mm, and may have a thickness of 1 mm to 30 mm, 1.5 mm to 30 mm, or 2 mm to 25 mm. The interposed layer 40 in an uncompressed state is typically thicker than the piezoelectric film 35 in an uncompressed state. The thickness of the interposed layer 40 in an uncompressed state is, for example, 3 or more times the thickness of the piezoelectric film 35 in an uncompressed state, and may be 10 or more times or 30 or more times the thickness of the piezoelectric film 35 in an uncompressed state. The interposed layer 40 in an uncompressed state is typically thicker than the first pressure-sensitive adhesive layer 51 in an uncompressed state.

A surface of the first pressure-sensitive adhesive layer 51 forms the pressure-sensitive adhesive face 17. The first pressure-sensitive adhesive layer 51 (the pressure-sensitive adhesive face 17) is disposed between the release layer 20 and the interposed layer 40. Specifically, the first pressure-sensitive adhesive layer 51 is joined to the release layer 20 and the interposed layer 40. Examples of the first pressure-sensitive adhesive layer 51 include a double-faced tape including a substrate and a pressure-sensitive adhesive applied to the both sides of the substrate. Examples of the substrate of the double-faced tape used as the first pressure-sensitive adhesive layer 51 include non-woven fabric. Examples of the pressure-sensitive adhesive of the double-faced tape used as the first pressure-sensitive adhesive layer 51 include pressure-sensitive adhesives including an acrylic resin. The first pressure-sensitive adhesive layer 51 may be a layer including no substrate and formed of a pressure-sensitive adhesive.

The thickness of the first pressure-sensitive adhesive layer 51 is, for example, 0.01 mm to 1.0 mm, and may be 0.05 mm to 0.5 mm.

The second pressure-sensitive adhesive layer 52 is disposed between the interposed layer 40 and the piezoelectric film 35. Specifically, the second pressure-sensitive adhesive layer 52 is joined to the interposed layer 40 and the piezoelectric film 35. Examples of the second pressure-sensitive adhesive layer 52 include a double-faced tape including a substrate and a pressure-sensitive adhesive applied to the both sides of the substrate. Examples of the substrate of the double-faced tape used as the second pressure-sensitive adhesive layer 52 include non-woven fabric. Examples of the pressure-sensitive adhesive of the double-faced tape used as the second pressure-sensitive adhesive layer 52 include pressure-sensitive adhesives including an acrylic resin. The second pressure-sensitive adhesive layer 52 may be a layer including no substrate and formed of a pressure-sensitive adhesive.

The thickness of the second pressure-sensitive adhesive layer 52 is, for example, 0.01 mm to 1.0 mm, and may be 0.05 mm to 0.5 mm.

In the present embodiment, the piezoelectric film 35 is integrated with the layers on the pressure-sensitive adhesive face 17 side by bringing an adhesive face or a pressure-sensitive adhesive face into contact with the piezoelectric film 35. Specifically, in the present embodiment, the adhesive face or the pressure-sensitive adhesive face is a face formed of a surface of the second pressure-sensitive adhesive or adhesive layer 52.

The release layer 20 is joined to the pressure-sensitive adhesive face 17. In this example, the release layer 20 is joined to the first pressure-sensitive adhesive layer 51. Typically, the release layer 20 covers the entire principal surface on the release layer 20 side of the first pressure-sensitive adhesive layer 51. The release layer 20, for example, includes a film and a release agent applied to the principal surface on the first pressure-sensitive adhesive layer 51 side of the film. Examples of the film of the release layer 20 include paper and resin films. Examples of the release agent of the release layer 20 include polymers having a long-chain alkyl group, fluorine-containing compounds and polymers, and silicone polymers.

Figure 3:
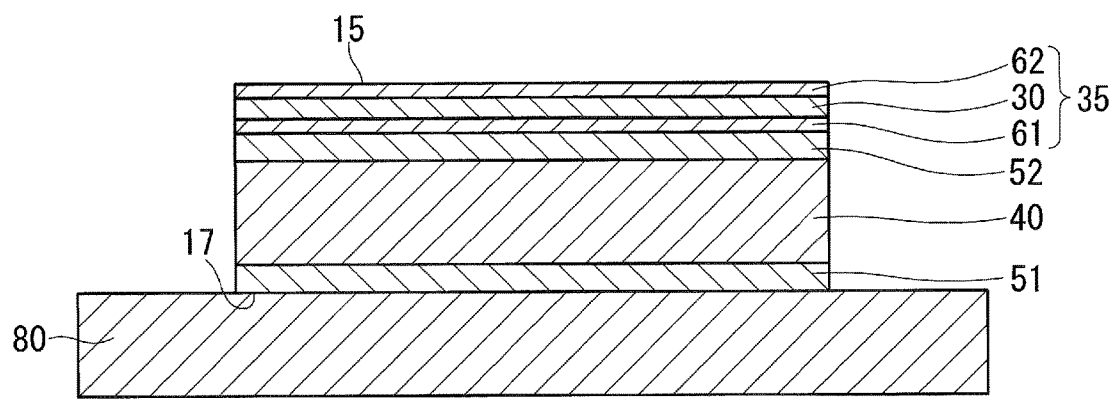
FIG. 3 illustrates a structure in which a piezoelectric speaker is fixed to a support.

As can be understood from FIG. 1 and FIG. 3, the piezoelectric film 35 and the interposed layer 40 are allowed to be fixed to the support 80 as a piezoelectric speaker or a portion of a piezoelectric speaker by sticking the pressure-sensitive adhesive face 17 from which the release layer 20 has been removed to the support 80. Such a sticking procedure is less troublesome to a person who does the procedure.

Voltage is applied to the piezoelectric film 35 fixed as above through the lead wires. This vibrates the piezoelectric film 35, and thus sound is emitted from the piezoelectric film 35. In the example in FIG. 3, the support 80 has a flat surface, a piezoelectric speaker is fixed to the flat surface, and the piezoelectric film 35 is extended flat thereon. This implementation is advantageous in that a sound wave radiated from the piezoelectric film 35 is close to a plane wave. When the support 80 has a curved surface, a piezoelectric speaker may be fixed onto the curved surface.

The area of a surface of the support 80, the surface facing the pressure-sensitive adhesive face 17, is typically equal to or greater than the area of the pressure-sensitive adhesive face 17. The former area is, for example, 1.0 or more times greater than the latter area, and may be 1.5 or more times or 5 or more times greater than the latter area. The support 80 typically has a high stiffness (a product of Young's modulus and the second moment of area), a high Young's modulus, and/or a great thickness, compared to the interposed layer 40. The support 80 may have the same stiffness, Young's modulus, and/or thickness as that of the interposed layer 40, or may have a lower stiffness, a lower Young's modulus, and/or a smaller thickness than that of the interposed layer 40. The support 80 has a Young's modulus of, for example, 1 GPa or more, and may have a Young's modulus of 10 GPa or more or 50 GPa or more. The upper limit of the Young's modulus of the support 80 is, for example, but not particularly limited to, 1000 GPa. Since various articles can be employed as the support 80, it is difficult to define the range of the thickness thereof. The thickness of the support 80 is, for example, 0.1 mm or more, and may be 1 mm or more, 10 mm or more, or 50 mm or more. The upper limit of thickness of the support 80 is, for example, but not particularly limited to, 1 m. The position and/or the shape of the support 80 typically does not vary depending on a piezoelectric speaker 10. The support 80 is typically produced on the assumption that the support 80 is not bent.

In some cases, the support 80 can include a plate-like portion and a base portion protruding from the plate-like portion in the thickness direction of the plate-like portion. In such cases, the piezoelectric film 35, the interposed layer 40, and the base portion can function as a piezoelectric speaker when the pressure-sensitive adhesive face 17 from which the release layer 20 has been removed is stuck to the base portion. This is an exemplary embodiment in which the piezoelectric film 35 and the interposed layer 40 are fixed to the support 80 as a portion of a piezoelectric speaker. The quality of material of the plate-like portion and that of the base portion can be the same or different.

A piezoelectric speaker fixed to the support 80 can be used as an acoustic speaker and as a speaker for sound reduction.

The piezoelectric speaker-forming laminate 10 according to the present embodiment will be further described.

As shown in FIG. 3, when the first pressure-sensitive adhesive layer 51 is stuck to the support 80, the interposed layer 40 is disposed between the piezoelectric film 35 and the support 80. The interposed layer 40 is a porous body layer and/or a resin layer. Such disposition and quality of material of the interposed layer 40 are suitable for preventing the support 80 from making it difficult to emit lower-frequency sound in the audible range from the resulting piezoelectric speaker.

It is likely that lower-frequency sound in the audible range is easily generated from the piezoelectric film 35 owing to the interposed layer 40 adequately holding one principal surface of the piezoelectric film 35, although the detail of the effect needs to be studied in the future. Given this, the interposed layer 40 can be disposed on a region accounting for 25% or more of the area of the piezoelectric film 35 when the piezoelectric film 35 is viewed in plan. The interposed layer 40 may be disposed on a region accounting for 50% or more of the area of the piezoelectric film 35, on a region accounting for 75% or more of the area of the piezoelectric film 35, or on the entire region of the piezoelectric film 35 when the piezoelectric film 35 is viewed in plan. 50% or more of a principal surface 15 of the piezoelectric speaker-forming laminate 10, the principal surface 15 being opposite to the release layer 20, can be composed of the piezoelectric film 35. 75% or more of the principal surface 15 may be composed of the piezoelectric film 35. The entire principal surface 15 may be composed of the piezoelectric film 35.

In the present embodiment, the second pressure-sensitive adhesive layer 52 prevents separation of the piezoelectric film 35 and the interposed layer 40. In view of adequate holding, which is mentioned above, the second pressure-sensitive adhesive layer 52 and the interposed layer 40 can be disposed on a region accounting for 25% or more of the area of the piezoelectric film 35 when the piezoelectric film 35 is viewed in plan. The second pressure-sensitive adhesive layer 52 and the interposed layer 40 may be disposed on a region accounting for 50% or more of the area of the piezoelectric film 35, on a region accounting for 75% or more of the area of the piezoelectric film 35, or on the entire region of the piezoelectric film 35 when the piezoelectric film 35 is viewed in plan.

When the interposed layer 40 is a porous body, the rate of the region where the interposed layer 40 is disposed is not defined from a microscopical perspective in consideration of pores in the porous structure of the interposed layer 40, but rather from a relatively macroscopic perspective. For example, when the piezoelectric film 35, the interposed layer 40 that is a porous body, and the second pressure-sensitive adhesive layer 52 are plate-like bodies having the same outline in plan, the second pressure-sensitive adhesive layer 52 and the interposed layer 40 are described as being disposed on a region accounting for 100% of the area of the piezoelectric film 35.

In the present embodiment, the interposed layer 40 has a holding degree of $5 \times 10^9$ N/m$^3$ or less. The interposed layer 40 has a holding degree of, for example, $1 \times 10^4$ N/m$^3$ or more. The interposed layer 40 preferably has a holding degree of $5 \times 10^8$ N/m$^3$ or less, more preferably $2 \times 10^8$ N/m$^3$ or less, and even more preferably $1 \times 10^5$ to $5 \times 10^7$ N/m$^3$. The holding degree (N/m$^3$) of the interposed layer 40 is a value obtained by dividing a product of the elastic modulus (N/m$^2$) of the interposed layer 40 and the surface filling factor of the interposed layer 40 by the thickness (m) of the interposed layer 40, as represented by the following equation. The surface filling factor of the interposed layer 40 is the filling factor (a value obtained by subtracting the porosity from 1) of the principal surface on the piezoelectric film 35 side of the interposed layer 40. When pores of the interposed layer 40 are evenly distributed, the surface filling factor can be regarded as equal to a three-dimensionally determined filling factor of the interposed layer 40.

Holding degree (N/m³)=Elastic modulus (N/m²)×Surface filling factor÷Thickness (m)

The holding degree can be considered to be a parameter representing the degree of holding the piezoelectric film 35 by means of the interposed layer 40. The above equation indicates that the greater the elastic modulus of the interposed layer 40 is, the greater the degree of holding becomes. The above equation indicates that the greater the surface filling factor of the interposed layer 40 is, the greater the degree of holding becomes. The above equation indicates that the smaller the thickness of the interposed layer 40 is, the greater the degree of holding becomes. Although the relationship between the holding degree of the interposed layer 40 and sound generated from the piezoelectric film 35 needs to be studied in the future, it is likely that an excessively great holding degree prevents the piezoelectric film 35 from deforming, which is necessary to emit lower-frequency sound. On the other hand, when the holding degree is excessively small, it is likely that the piezoelectric film 35 does not sufficiently deform in its thickness direction and extends and contracts only in its in-plane direction (the direction perpendicular to the thickness direction) and thus generation of lower-frequency sound is prevented. It is thought that since the holding degree of the interposed layer 40 is set within an adequate range, extension and contraction of the piezoelectric film 35 in the in-plane direction is adequately converted into deformation thereof in the thickness direction and that results in appropriate bending of the piezoelectric film 35 as a whole and makes it easy to generate lower-frequency sound.

As can be understood from the above description, there may be a layer other than the interposed layer 40 between the piezoelectric film 35 and the pressure-sensitive adhesive face 17. The other layer is, for example, the second pressure-sensitive adhesive layer 52.

The support 80 may have a greater holding degree than that of the interposed layer 40. In this case as well, lower-frequency sound can be generated from the piezoelectric film 35 because of the contribution of the interposed layer 40. The support 80 may have the same holding degree as that of the interposed layer 40, or may have a smaller holding degree than that of the interposed layer 40. The holding degree (N/m³) of the support 80 is a value obtained by dividing a product of the elastic modulus (N/m²) of the support 80 and the surface filling factor of the support 80 by the thickness (m) of the support 80. The surface filling factor of the support 80 is the filling factor (a value obtained by subtracting the porosity from 1) of the principal surface on the piezoelectric film 35 side of the support 80.

The pressure-sensitive adhesive face 17 is disposed so that at least a portion of the piezoelectric film 35 overlaps the first pressure-sensitive adhesive layer 51 when the piezoelectric film 35 is viewed in plan. In view of stably fixing a piezoelectric speaker to the support 80, the pressure-sensitive adhesive face 17 can be disposed on a region accounting for 50% or more of the area of the piezoelectric film 35 when the piezoelectric film 35 is viewed in plan. The pressure-sensitive adhesive face 17 may be disposed on a region accounting for 75% or more of the area of the piezoelectric film 35 or on the entire region of the piezoelectric film 35 when the piezoelectric film 35 is viewed in plan.

In the present embodiment, layers located between the piezoelectric film 35 and the pressure-sensitive adhesive face 17 and adjacent to each other are joined together. The location between the piezoelectric film 35 and the pressure-sensitive adhesive face 17 includes the piezoelectric film 35 and the pressure-sensitive adhesive face 17. Specifically, the first pressure-sensitive adhesive layer 51 and the interposed layer 40 are joined together, the interposed layer 40 and the second pressure-sensitive adhesive layer 52 are joined together, and the second pressure-sensitive adhesive layer 52 and the piezoelectric film 35 are joined together. This allows the piezoelectric film 35 to be stably disposed regardless of the orientation in which the piezoelectric film 35 is attached to the support 80. This also makes it easy to attach the piezoelectric film 35 to the support 80. Moreover, because of the contribution of the interposed layer 40, sound is emitted from the piezoelectric film 35 regardless of the orientation in which the piezoelectric film 35 is attached. Thus, in the present embodiment, the combination of these allows achievement of a piezoelectric speaker of high usability. The expression "layers adjacent to each other are joined" means that layers adjacent to each other are entirely or partly joined together. In the illustrated examples, the layers adjacent to each other are joined together in a given portion extending in the thickness direction of the piezoelectric film 35 in the order from the piezoelectric film 35, to the interposed layer 40, and to the pressure-sensitive adhesive face 17.

Figure 4:
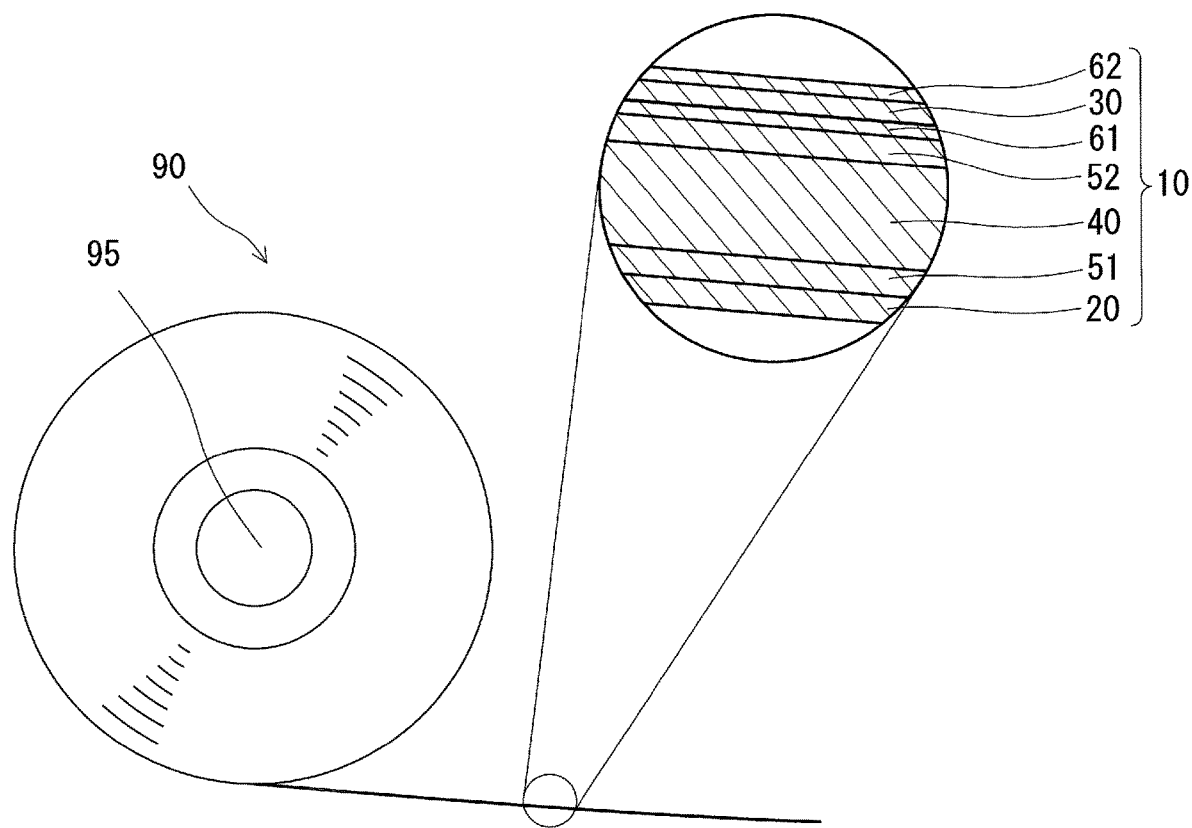
FIG. 4 shows a wound body of a piezoelectric speaker-forming laminate.

In the present embodiment, the piezoelectric film 35, the interposed layer 40, and the release layer 20 each have a substantially uniform thickness. This is often advantageous from various points of view, for example, in view of storage of the piezoelectric speaker-forming laminate 10, the usability thereof, and control of sound emitted from the piezoelectric film 35. In a specific example shown in FIG. 4, the laminate 10 has the shape of a band-like body and has a form of a wound body 90 wound in a longitudinal direction of the band-like body (in FIG. 4, the laminate 10 is wound around a core material 95, and a portion of the laminate 10 is drawn out from the wound body 90). Having the substantially uniform thicknesses as described above can make achievement of such a form easier. Having a "substantially uniform thickness" refers to, for example, having the smallest thickness which is 70% or more and 100% or less of the largest thickness. The smallest thickness of each of the piezoelectric film 35, the interposed layer 40, and the release layer 20 may be 85% or more and 100% or less of the largest thickness.

Resin is a material less likely to be cracked than, for example, ceramics. In a specific example, the piezoelectric body 30 of the piezoelectric film 35 is a resin film and the interposed layer 40 is a resin layer not functioning as a piezoelectric film. This specific example is advantageous in that the piezoelectric speaker-forming laminate 10 is cut, for example, with scissors or by hand without cracking the piezoelectric body 30 or the interposed layer 40. Additionally, in this specific example, the piezoelectric body 30 or the interposed layer 40 is unlikely to be cracked by bending the laminate 10. This is advantageous when a wound body as described above is configured. Moreover, that the piezoelectric body 30 is a resin film and the interposed layer 40 is a resin layer is advantageous in that a piezoelectric speaker is configured on a curved surface without cracking the piezoelectric body 30 or the interposed layer 40.

In the examples in FIG. 1 and FIG. 3, the piezoelectric film 35, the interposed layer 40, the first pressure-sensitive adhesive layer 51, and the second pressure-sensitive adhesive layer 52 each have the shape of a plate which is neither divided nor frame-shaped, and share the same outline when viewed in plan. Some or all of the piezoelectric film 35, the interposed layer 40, the first pressure-sensitive adhesive layer 51, and the second pressure-sensitive adhesive layer 52 may have the shape of a frame. Some or all thereof may be divided into two or more. Their outlines may be misaligned.

In the examples in FIG. 1 and FIG. 3, the piezoelectric film 35, the interposed layer 40, the first pressure-sensitive adhesive layer 51, and the second pressure-sensitive adhesive layer 52 are each a rectangle having a short side and a long side when viewed in plan. The piezoelectric film 35, the interposed layer 40, the first pressure-sensitive adhesive layer 51, and the second pressure-sensitive adhesive layer 52 each may be, for example, a square, a circle, or an oval.

The piezoelectric speaker-forming laminate may also include a layer other than the layers shown in FIG. 1.

Second Embodiment

Figure 5:
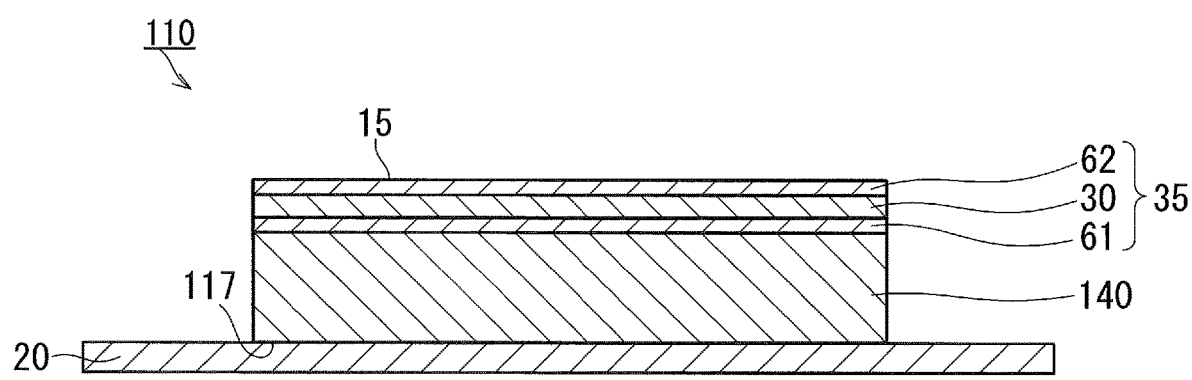
FIG. 5 shows a piezoelectric speaker-forming laminate according to another embodiment.

A piezoelectric speaker-forming laminate 110 according to a second embodiment will be described using FIG. 5. The features identical to those of the first embodiment may not be described hereinafter.

The piezoelectric speaker-forming laminate 110 includes the piezoelectric film 35, a pressure-sensitive adhesive face 117, an interposed layer 140, and the release layer 20. The interposed layer 140 is located between the piezoelectric film 35 and the pressure-sensitive adhesive face 117. (The location between the piezoelectric film 35 and the pressure-sensitive adhesive face 117 includes the pressure-sensitive adhesive face 117. The same applies to the first embodiment.) Specifically, the interposed layer 140 is a pressure-sensitive adhesive layer, and the pressure-sensitive adhesive face 117 is formed of a surface (principal surface) of the interposed layer 140. The release layer 20, the interposed layer 140, and the piezoelectric film 35 are laminated in this order.

The interposed layer 140 is a porous body layer and/or a resin layer. A pressure-sensitive adhesive including an acrylic resin can be used as the interposed layer 140. Another pressure-sensitive adhesive, for example, a pressure-sensitive adhesive including rubber, silicone, or urethane may be used as the interposed layer 140. The interposed layer 140 may be a blended layer including two or more materials.

The elastic modulus of the interposed layer 140 is, for example, 10000 N/m² to 20000000 N/m², and may be 20000 N/m² to 100000 N/m².

The interposed layer 140 in an uncompressed state has a thickness of, for example, 0.1 mm to 30 mm, and may have a thickness of 1 mm to 30 mm, 1.5 mm to 30 mm, or 2 mm to 25 mm. The interposed layer 140 in an uncompressed state is typically thicker than the piezoelectric film 35 in an uncompressed state. The thickness of the interposed layer 140 in an uncompressed state is, for example, 3 or more times the thickness of the piezoelectric film 35 in an uncompressed state, and may be 10 or more times or 30 or more times the thickness of the piezoelectric film 35 in an uncompressed state.

In the present embodiment, the interposed layer 140 has a holding degree of $5 \times 10^9$ N/m³ or less. The interposed layer 140 has a holding degree of, for example, $1 \times 10^4$ N/m³ or more. The interposed layer 140 preferably has a holding degree of $5 \times 10^8$ N/m³ or less, more preferably $2 \times 10^8$ N/m³ or less, and even more preferably $1 \times 10^5$ to $5 \times 10^7$ N/m³. The definition of the holding degree is as described previously.

In the present embodiment, the piezoelectric film 35 is integrated with the layer on the pressure-sensitive adhesive face 117 side by bringing an adhesive face or a pressure-sensitive adhesive face into contact with the piezoelectric film 35. Specifically, in the present embodiment, the adhesive face or the pressure-sensitive adhesive face is a face formed of the interposed layer 140.

In the case of the laminate 110 as well, the piezoelectric film 35 and the interposed layer 140 are allowed to be fixed to the support 80 of FIG. 3 as a piezoelectric speaker or a portion of a piezoelectric speaker by sticking the pressure-sensitive adhesive face 117 from which the release layer 20 has been removed to the support 80.

EXAMPLES

The present invention will be described in detail using Examples. It should be noted that Examples given below are only illustrative of the present invention and do not limit the present invention.

Example 1

A release layer 20 is removed from a laminate including the release layer 20, a first pressure-sensitive adhesive layer 51, an interposed layer 40, a second pressure-sensitive adhesive layer 52, and a piezoelectric film 35 laminated in this order. The resultant laminate was stuck with the aid of the first pressure-sensitive adhesive layer 51 to a support 80 fixed. A structure as shown in FIG. 3 was thus produced. Specifically, a 5-mm-thick stainless steel plate (SUS plate) was used as the support 80. A 0.16-mm-thick pressure-sensitive adhesive sheet (double-faced tape) including non-woven fabric both sides of which were impregnated with an acrylic adhesive was used as the first pressure-sensitive adhesive layer 51. A 3-mm-thick closed-cell foam obtained by foaming a mixture including ethylene propylene rubber and butyl rubber by a foaming factor of about 10 was used as the interposed layer 40. A 0.15-mm-thick pressure-sensitive adhesive sheet (double-faced tape) including non-woven fabric as a substrate to the both sides of which a pressure-sensitive adhesive including a solventless acrylic resin was applied was used as the second pressure-sensitive adhesive layer 52. A polyvinylidene fluoride film on each side of which a copper electrode (including nickel) was vapor-deposited (total thickness: 33 μm) was used as the piezoelectric film 35. The first pressure-sensitive adhesive layer 51, the interposed layer 40, the second pressure-sensitive adhesive layer 52, and the piezoelectric film 35 of Example 1 each have dimensions of 37.5 mm long by 37.5 mm wide when viewed in plan, each have the shape of a plate which is neither divided nor frame-shaped, and have outlines overlapping when viewed in plan. (The same applies to Examples and Reference Example described later.) The support 80 has dimensions of 50 mm long by 50 mm wide when viewed in plan and covers the entire first pressure-sensitive adhesive layer 51. A sample of Example 1 having a structure as shown in FIG. 3 was produced in this manner.

Example 2

A 3-mm-thick semi-open-/semi-closed-cell foam obtained by foaming a mixture including ethylene propylene rubber by a foaming factor of about 10 was used as an interposed layer 40. This foam includes sulfur. Except for that, a sample of Example 2 was produced in the same manner as in Example 1.

Example 3

A 5-mm-thick foam formed of the same material and having the same configuration as those of the interposed layer 40 of Example 2 was used as an interposed layer 40 in Example 3. Except for that, a sample of Example 3 was produced in the same manner as in Example 2.

Example 4

A 10-mm-thick foam formed of the same material and having the same configuration as those of the interposed layer 40 of Example 2 was used as an interposed layer 40 in Example 4. Except for that, a sample of Example 4 was produced in the same manner as in Example 2. Example 5

A 20-mm-thick foam formed of the same material and having the same configuration as those of the interposed layer 40 of Example 2 was used as an interposed layer 40 in Example 5. Except for that, a sample of Example 5 was produced in the same manner as in Example 2.

Example 6

A 20-mm-thick semi-open-/semi-closed-cell foam obtained by foaming a mixture including ethylene propylene rubber by a foaming factor of about 10 was used as an interposed layer 40. This foam does not include sulfur and is more flexible than the foams used as the interposed layers 40 of Examples 2 to 5. Except for that, a sample of Example 6 was produced in the same manner as in Example 1.

Example 7

A 20-mm-thick semi-open-/semi-closed-cell foam obtained by foaming a mixture including ethylene propylene rubber by a foaming factor of about 20 was used as an interposed layer 40. Except for that, a sample of Example 7 was produced in the same manner as in Example 1.

Example 8

A porous metal body was used as an interposed layer 40. This porous metal body is made of nickel and has a pore diameter of 0.9 mm and a thickness of 2.0 mm. A pressure-sensitive adhesive layer same as a first pressure-sensitive adhesive layer 51 as used in Example 1 was used as a second pressure-sensitive adhesive layer 52. Except for those, a sample of Example 8 was produced in the same manner as in Example 1.

Example 9

A first pressure-sensitive adhesive layer 51 and a second pressure-sensitive adhesive layer 52 as used in Example 1 were omitted, and only an interposed layer 140 was interposed between a piezoelectric film 35 and a support 80 as used in Example 1. A 3-mm-thick substrate-less pressure-sensitive adhesive sheet formed of an acrylic pressure-sensitive adhesive was used as the interposed layer 140. Except for those, a sample of Example 9 having a structure in which a release layer 20 as in FIG. 5 is removed from a laminate 110 as in FIG. 5 and the resulting laminate is attached to a support 80 as in FIG. 3 was produced in the same manner as in Example 1.

Example 10

An interposed layer same as an interposed layer 140 as used in Example 9 was used as an interposed layer 40. Except for that, a sample of Example 10 was produced in the same manner as in Example 8.

Example 11

A 5-mm-thick urethane foam was used as an interposed layer 40. Except for that, a sample of Example 11 was produced in the same manner as in Example 8.

Example 12

A 10-mm-thick urethane foam was used as an interposed layer 40. This urethane foam has a smaller pore diameter than that of the urethane foam used as the interposed layer 40 of Example 11. Except for that, a sample of Example 12 was produced in the same manner as in Example 8.

Example 13

A 5-mm-thick closed-cell acrylonitrile butadiene rubber foam was used as an interposed layer 40. Except for that, a sample of Example 13 was produced in the same manner as in Example 8.

Example 14

A 5-mm-thick closed-cell ethylene propylene rubber foam was used as an interposed layer 40. Except for that, a sample of Example 14 was produced in the same manner as in Example 8.

Example 15

A 5-mm-thick closed-cell foam in which natural rubber and styrene-butadiene rubber are blended was used as an interposed layer 40. Except for that, a sample of Example 15 was produced in the same manner as in Example 8.

Example 16

A 5-mm-thick closed-cell silicone foam was used as an interposed layer 40. Except for that, a sample of Example 16 was produced in the same manner as in Example 8.

Example 17

A 10-mm-thick foam formed of the same materials and having the same configuration as those of the interposed layer 40 of Example 1 was used as an interposed layer 40. A pressure-sensitive adhesive sheet same as the one used as the second pressure-sensitive adhesive layer 52 in Example 1 was used as a second pressure-sensitive adhesive layer 52. A 35-μm-thick resin sheet including a corn-derived polylactic acid as a main raw material was used as a piezoelectric body 30 of a piezoelectric film 35. A first electrode 61 and a second electrode 62 of the piezoelectric film 35 are each formed of a 0.1-μm-thick aluminum film and were formed by vapor deposition. A piezoelectric film 35 having a total thickness of 35.2 μm was thus obtained. Except for those, a sample of Example 17 was produced in the same manner as in Example 1.

Reference Example 1

A piezoelectric film 35 as used in Example 1 was employed as a sample of Reference Example 1. In Reference Example 1, the sample was placed on a board parallel to the ground without being adhered to the board.

The methods for evaluation of the samples according to Examples and Reference Example are as follows.

<Thickness of Interposed Layer (Uncompressed State)>

The thickness of each of the interposed layers was measured using a thickness gauge.

<Elastic Modulus of Interposed Layer>

A small piece was cut out from each of the interposed layers. The small piece was subjected to a compression test at ordinary temperature using a tensile tester ("RSA-G2" manufactured by TA Instruments). A stress-strain curve was thus obtained. The elastic modulus was calculated from the initial slope of the stress-strain curve.

<Pore Diameter of Interposed Layer>

An enlarged image of each of the interposed layers was obtained using a microscope. The average of the pore diameters of the interposed layer was determined by image analysis of the enlarged image. The average thus determined was employed as the pore diameter of the interposed layer.

<Porosity of Interposed Layer>

A small rectangular cuboid piece was cut out from each of the interposed layers. The apparent density was determined from the volume and the mass of the small rectangular cuboid piece. The apparent density was divided by the density of a matrix (solid, or non-hollow, body) forming the interposed layer. The filling factor was thus calculated. Then, the filling factor was subtracted from 1. The porosity was thus obtained.

<Surface Filling Factor of Interposed Layer>

For Examples 2 to 16, the filling factor calculated as above is employed as the surface filling factor. For Examples 1 and 17, the surface filling factor is 100% because the interposed layers have a surface skin layer.

<Frequency Characteristics of Sample in Terms of Sound Pressure Level>

Figure 6:
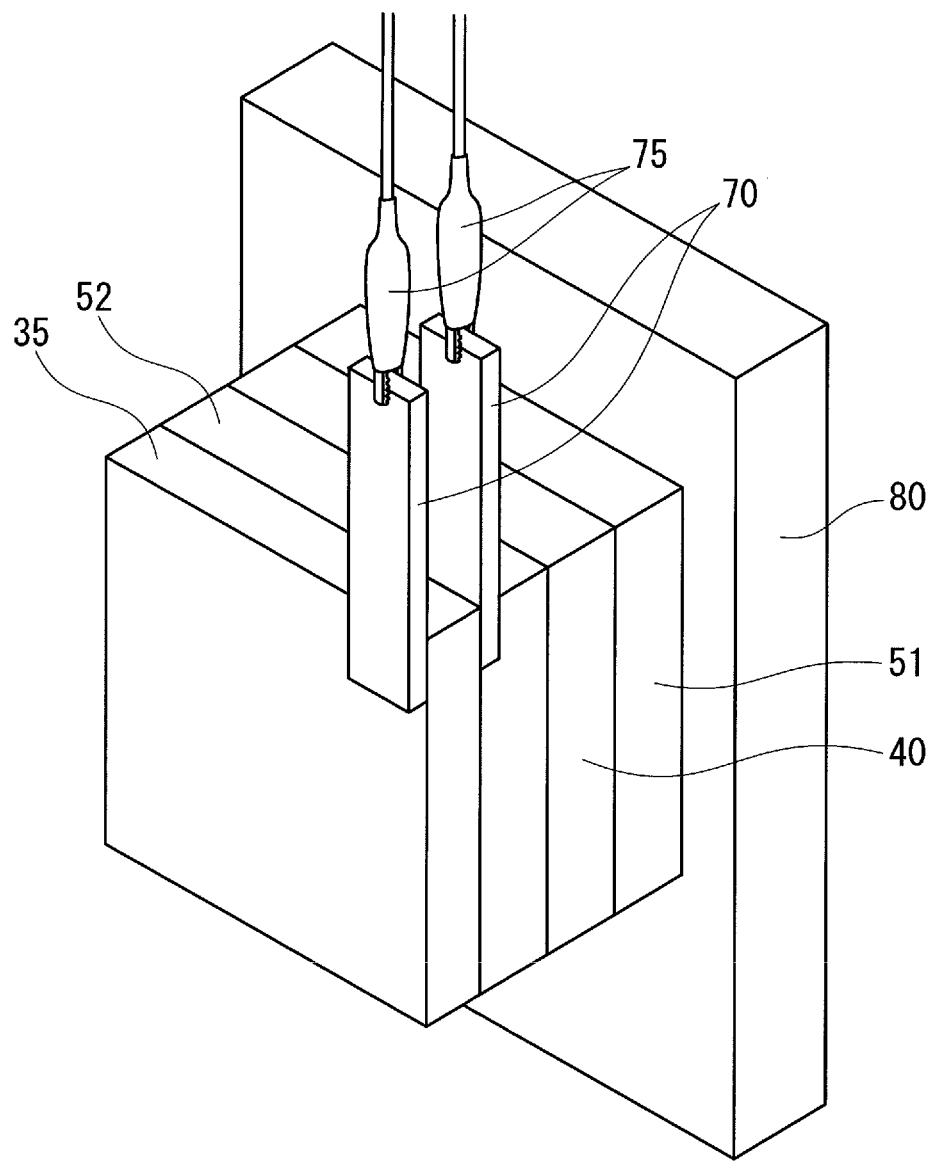
FIG. 6 illustrates a structure for measurement of a sample.

A structure for measurement of the samples of Examples 1 to 8 and 10 to 17 is shown in FIG. 6. An electrically conductive copper foil tape 70 (CU–35C manufactured by 3M) having dimensions of 70 μm thick by 5 mm long by 70 mm wide was attached to a corner of each side of the piezoelectric film 35. An alligator clip 75 with a cover was attached to each of the electrically conductive copper foil tapes 70. The electrically conductive copper foil tapes 70 and the alligator clips 75 with covers compose a portion of an electrical pathway used for application of AC voltage to the piezoelectric film 35.

Figure 7:
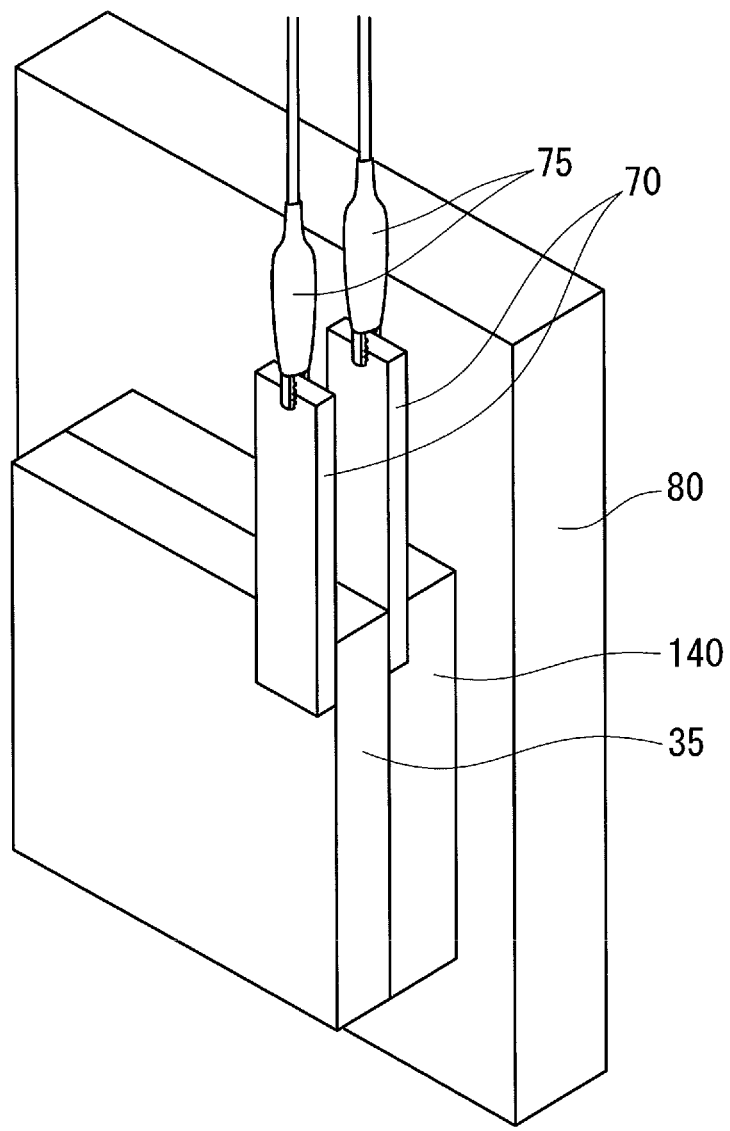
FIG. 7 illustrates a structure for measurement of a sample.

A structure for measurement of the sample of Example 9 is shown in FIG. 7. The structure in FIG. 7 lacks the first pressure-sensitive adhesive layer 51 and the second pressure-sensitive adhesive layer 52 of FIG. 6. The structure in FIG. 7 includes the interposed layer 140.

A structure for measurement of the sample of Reference Example 1 is based on the structures of FIG. 6 and FIG. 7. Specifically, as in FIG. 6 and FIG. 7, an electrically conductive copper foil tape 70 was attached to a corner of each side of the piezoelectric film 35, and an alligator clip 75 with a cover was attached to each of the tapes 70. The resulting assembly was placed on a board parallel to the ground without being adhered to the board.

Figure 8:
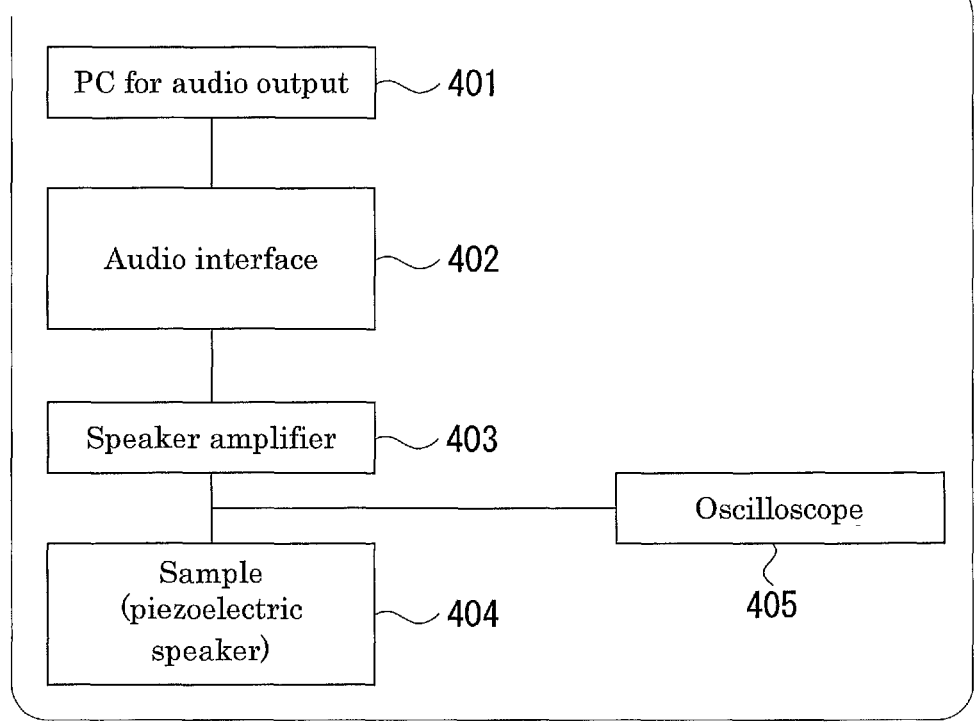
FIG. 8 is a block diagram of an output system.
Figure 9:
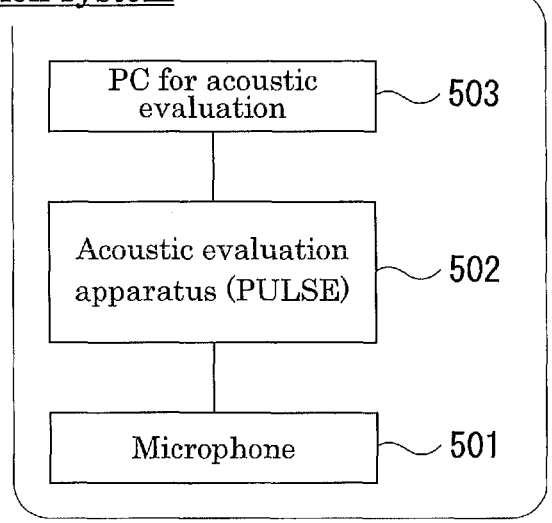
FIG. 9 is a block diagram of an evaluation system.

Block diagrams for measurement of the acoustic characteristics of the samples are shown in FIG. 8 and FIG. 9. Specifically, an output system is shown in FIG. 8, and an evaluation system is shown in FIG. 9.

In the output system shown in FIG. 8, a personal computer (a personal computer may hereinafter be simply described as a PC) 401 for audio output, an audio interface 402, a speaker amplifier 403, a sample 404 (any of the piezoelectric speakers of Examples and Reference Example) were connected in this order. The speaker amplifier 403 was also connected to an oscilloscope 405 so that output from the speaker amplifier 403 to the sample 404 could be monitored.

WaveGene was installed in the PC 401 for audio output. WaveGene is free software for generation of a test audio signal. QUAD-CAPTURE manufactured by Roland Corporation was used as the audio interface 402. The sampling frequency of the audio interface 402 was set to 192 kHz. A-924 manufactured by Onkyo Corporation was used as the speaker amplifier 403. DPO2024 manufactured by Tektronix, Inc. was used as the oscilloscope 405.

In the evaluation system shown in FIG. 9, a microphone 501, an acoustic evaluation apparatus (PULSE) 502, and a PC 503 for acoustic evaluation were connected in this order.

Type 4939-C-002 manufactured by Bruel & Kjaer Sound & Vibration Measurement A/S was used as the microphone 501. The microphone 501 was disposed 1 m away from the sample 404. Type 3052-A-030 manufactured by Bruel & Kjaer Sound & Vibration Measurement A/S was used as the acoustic evaluation apparatus 502.

The output system and the evaluation system were configured in the above manners. AC voltage was applied from the PC 401 for audio output to the sample 404 via the audio interface 402 and the speaker amplifier 403. Specifically, a test audio signal whose frequency sweeps from 100 Hz to 100 kHz in 20 seconds was generated using the PC 401 for audio output. During this, voltage output from the speaker amplifier 403 was monitored using the oscilloscope 405. Additionally, sound generated from the sample 404 was evaluated using the evaluation system. A test for measurement of the sound pressure frequency characteristics was performed in this manner.

The details of the output system and evaluation system settings are as follows.

[Output System Settings]
Frequency range: 100 Hz to 100 kHz
Sweep time: 20 seconds
Effective voltage: 10 V
Output waveform: sine curve

[Evaluation System Settings]
Measurement time: 22 seconds
Peak hold
Measurement range: 4 Hz to 102.4 kHz
Number of lines: 6400

<Determination of Frequency at Which Emission of Sound Starts>

The lower end of a frequency domain (exclusive of a sharp peak portion in which a frequency range where the sound pressure level is maintained higher than that of background noise by +3 dB or more falls within ±10% of a peak frequency (a frequency at which the sound pressure level reaches a peak)) where the sound pressure level is higher than that of background noise by 3 dB or more was determined as a frequency at which emission of sound starts.

Figure 11:
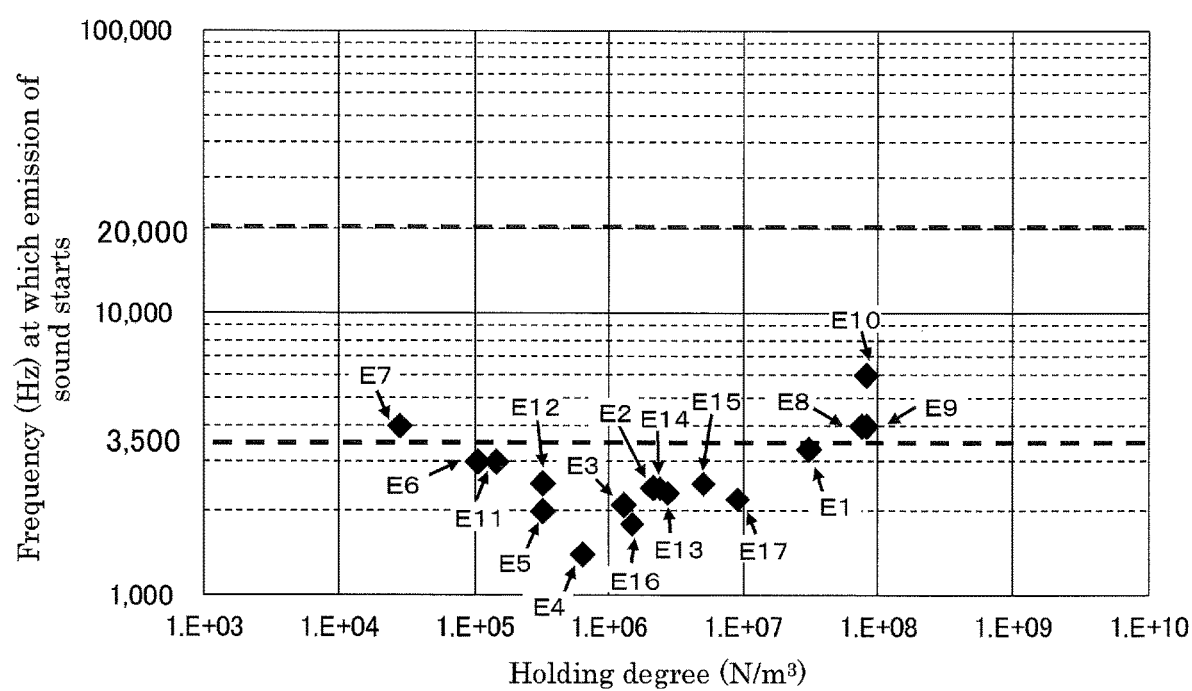
FIG. 11 is a graph showing a relationship between the holding degree of an interposed layer and a frequency at which emission of sound starts.
Figure 12:
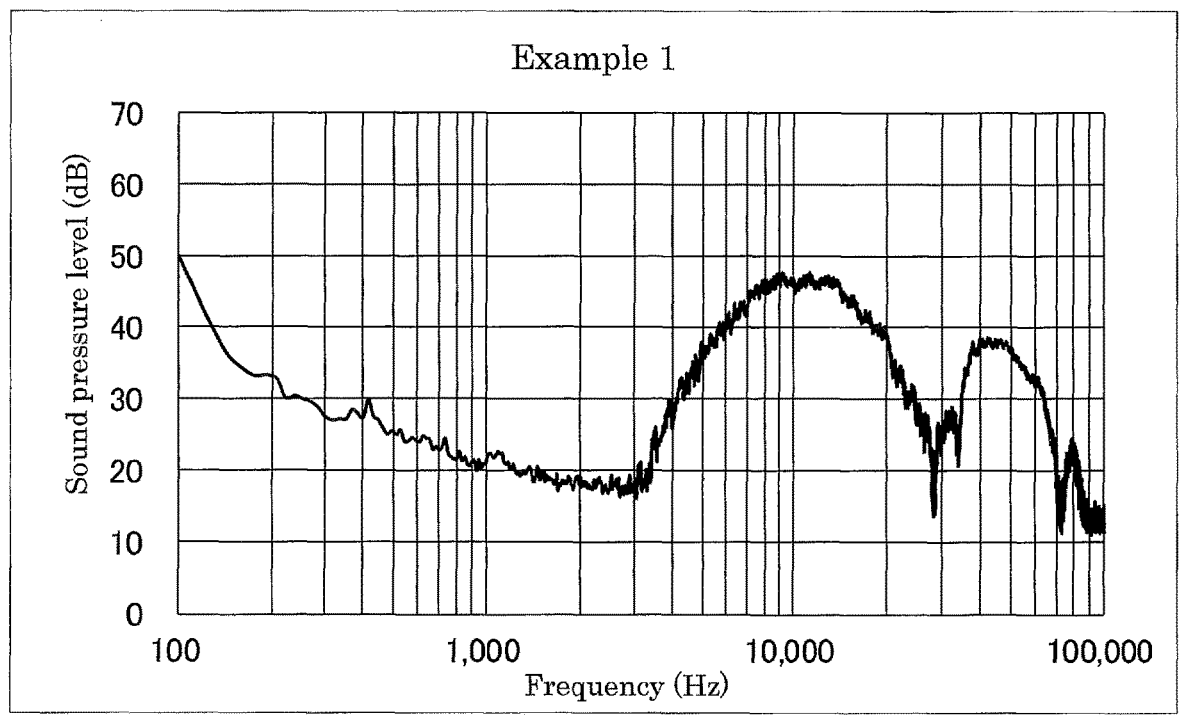
FIG. 12 is a graph showing the frequency characteristics of a sample of Example 1 in terms of sound pressure level.
Figure 13:
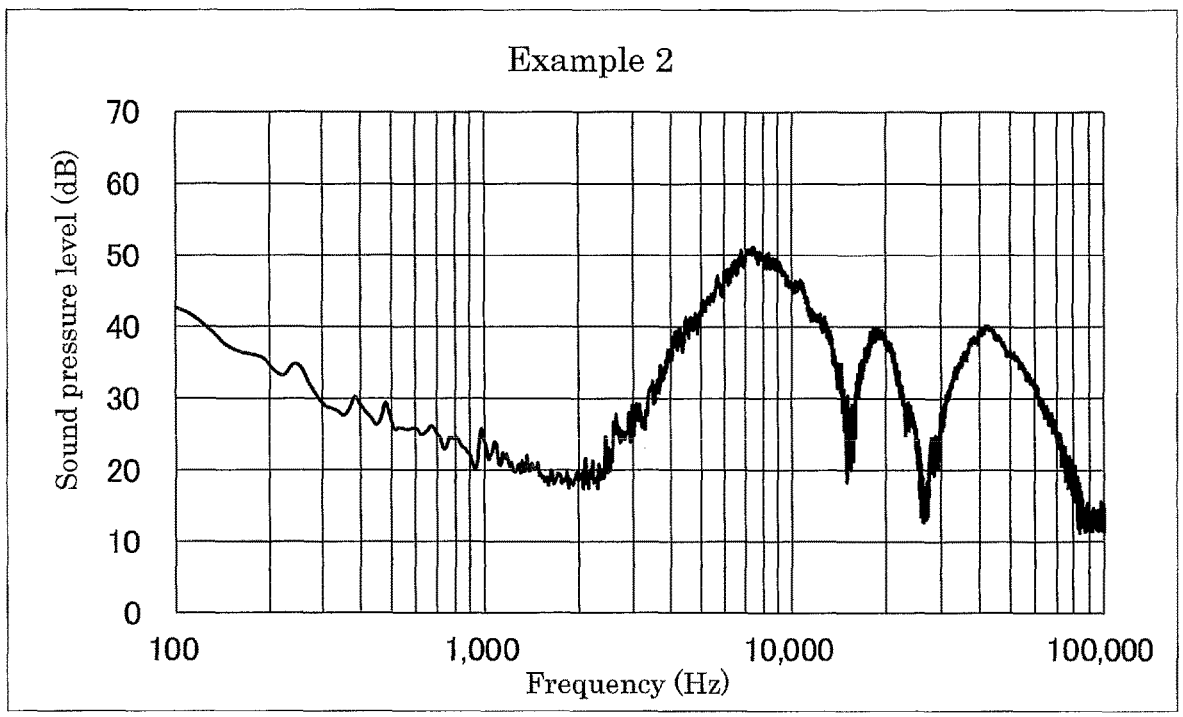
FIG. 13 is a graph showing the frequency characteristics of a sample of Example 2 in terms of sound pressure level.
Figure 14:
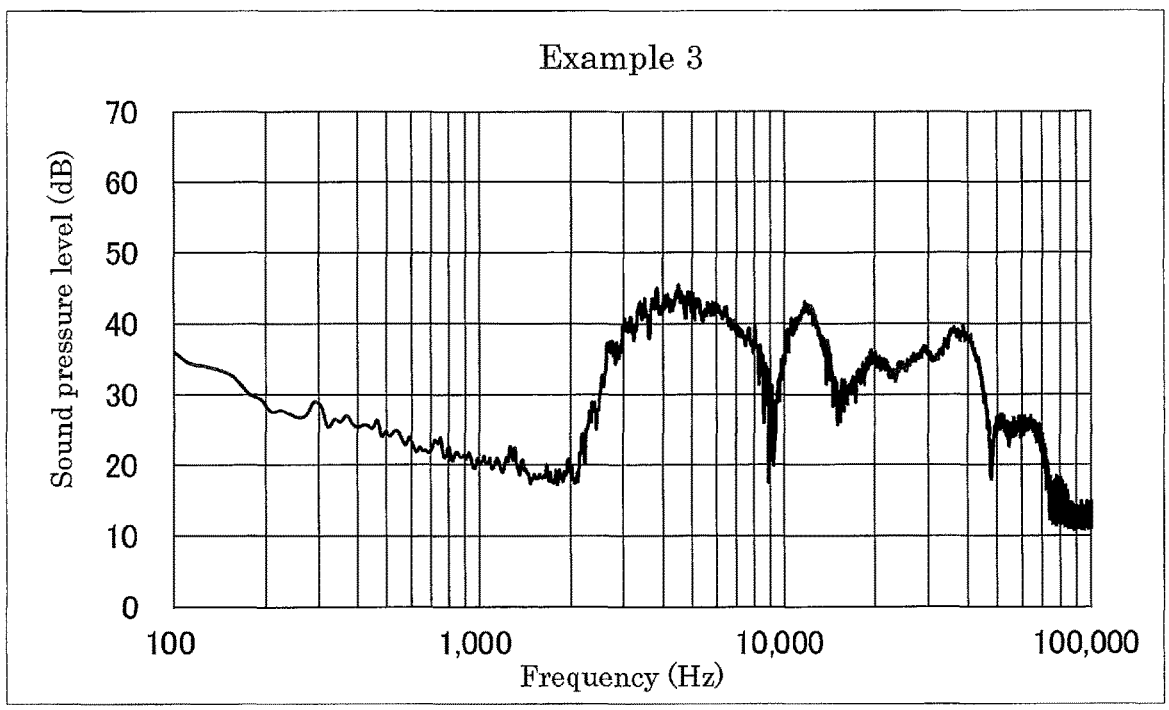
FIG. 14 is a graph showing the frequency characteristics of a sample of Example 3 in terms of sound pressure level.
Figure 15:
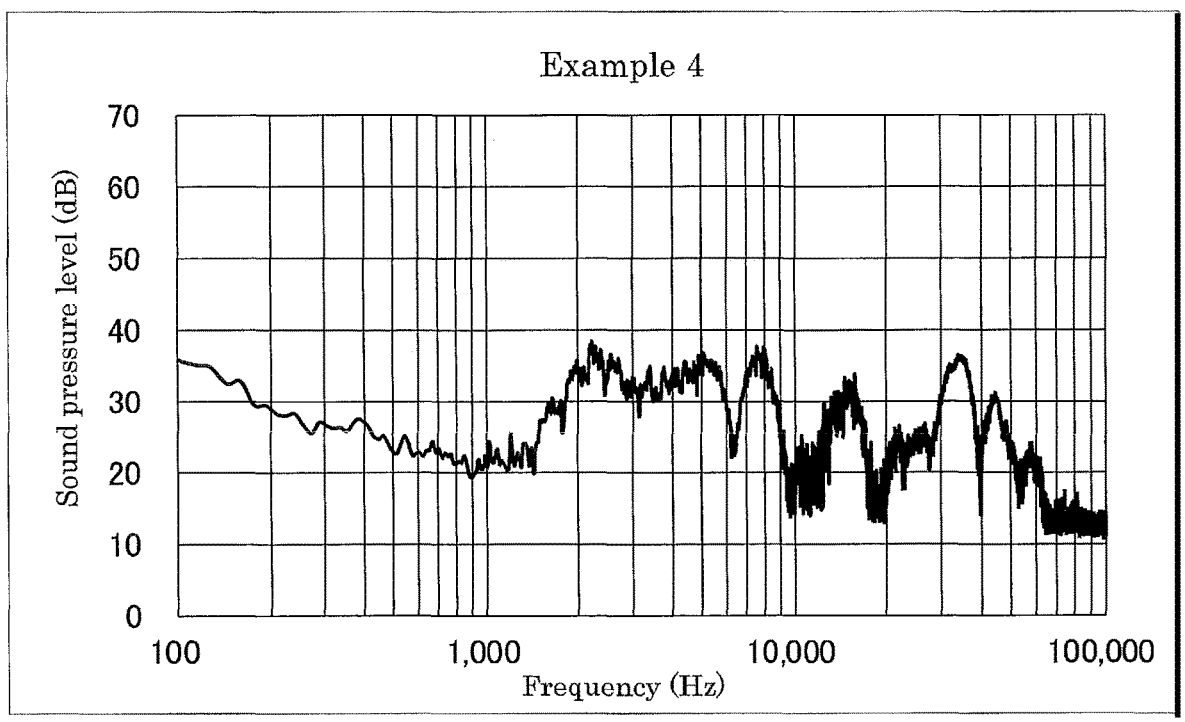
FIG. 15 is a graph showing the frequency characteristics of a sample of Example 4 in terms of sound pressure level.
Figure 16:
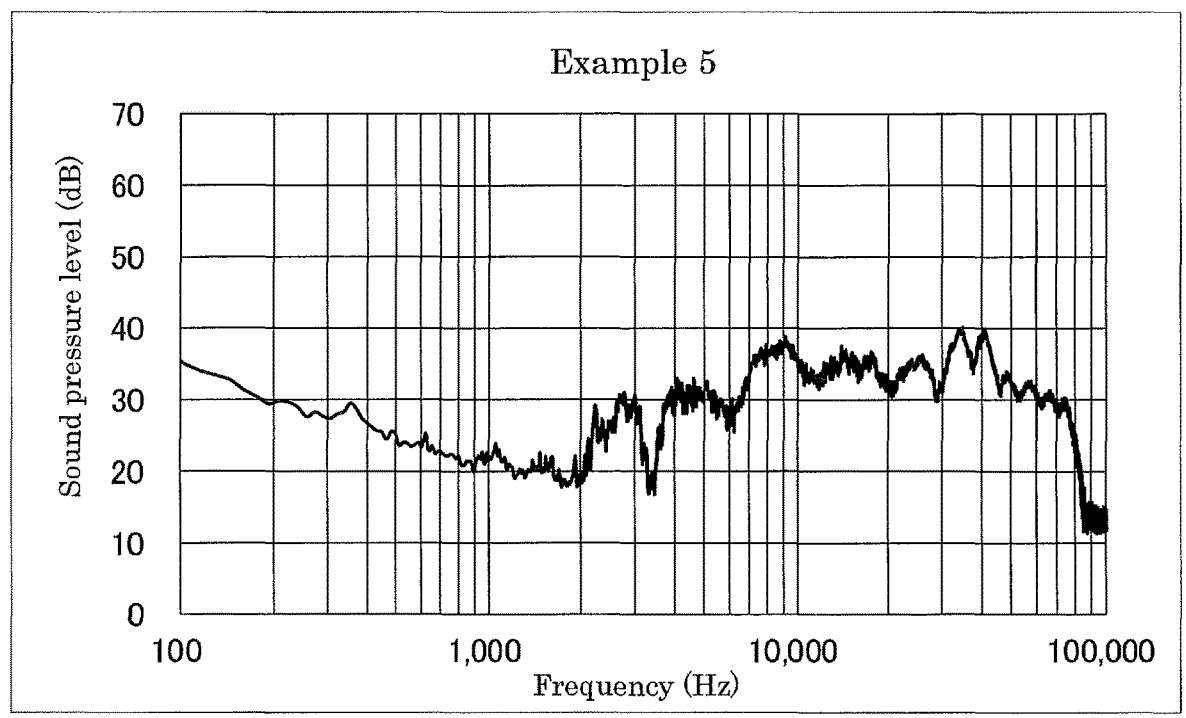
FIG. 16 is a graph showing the frequency characteristics of a sample of Example 5 in terms of sound pressure level.
Figure 17:
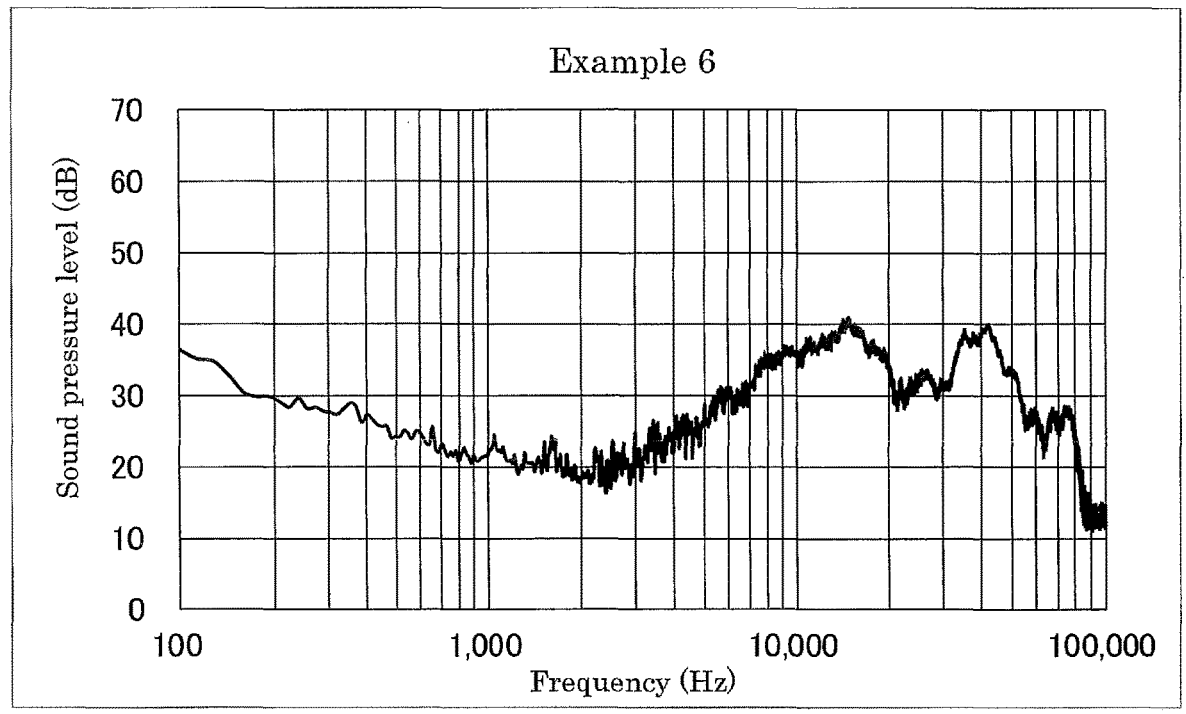
FIG. 17 is a graph showing the frequency characteristics of a sample of Example 6 in terms of sound pressure level.
Figure 18:
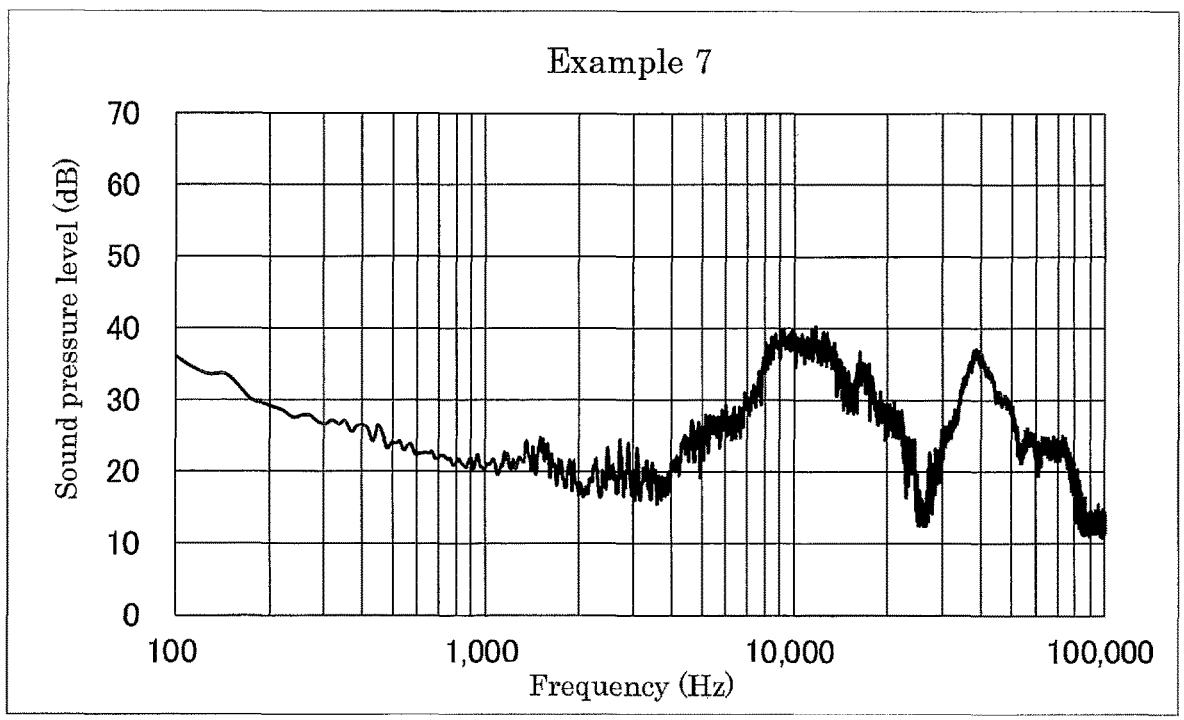
FIG. 18 is a graph showing the frequency characteristics of a sample of Example 7 in terms of sound pressure level.
Figure 19:
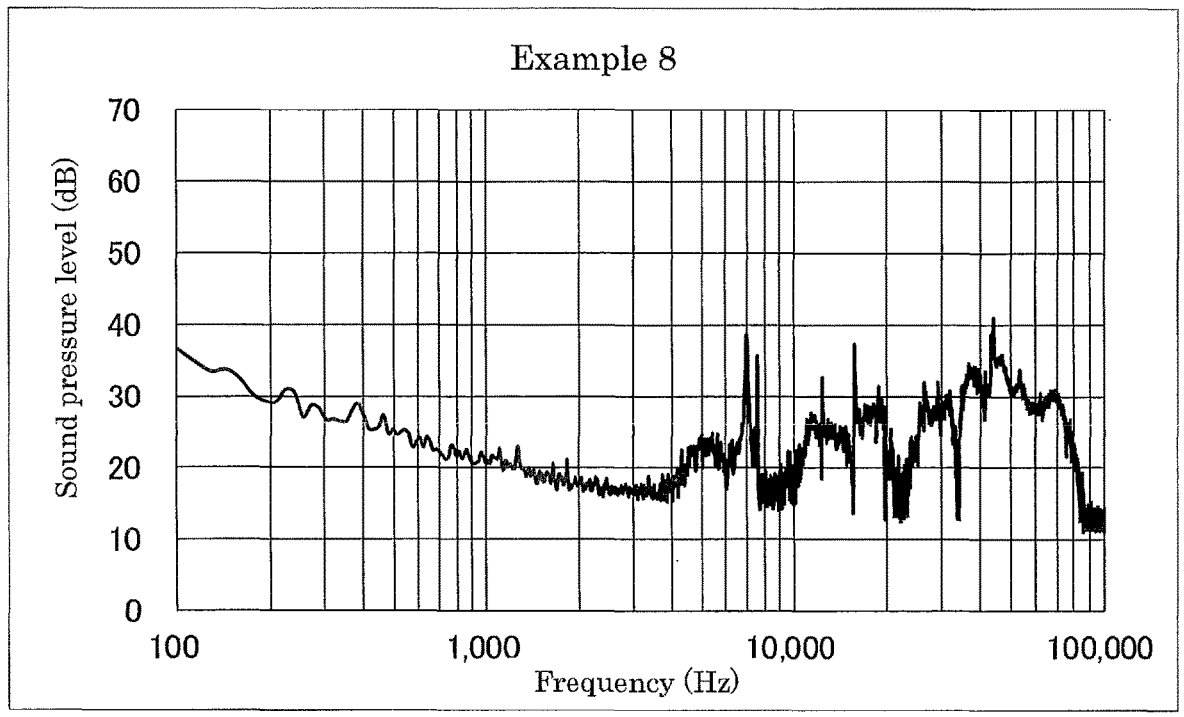
FIG. 19 is a graph showing the frequency characteristics of a sample of Example 8 in terms of sound pressure level.
Figure 20:
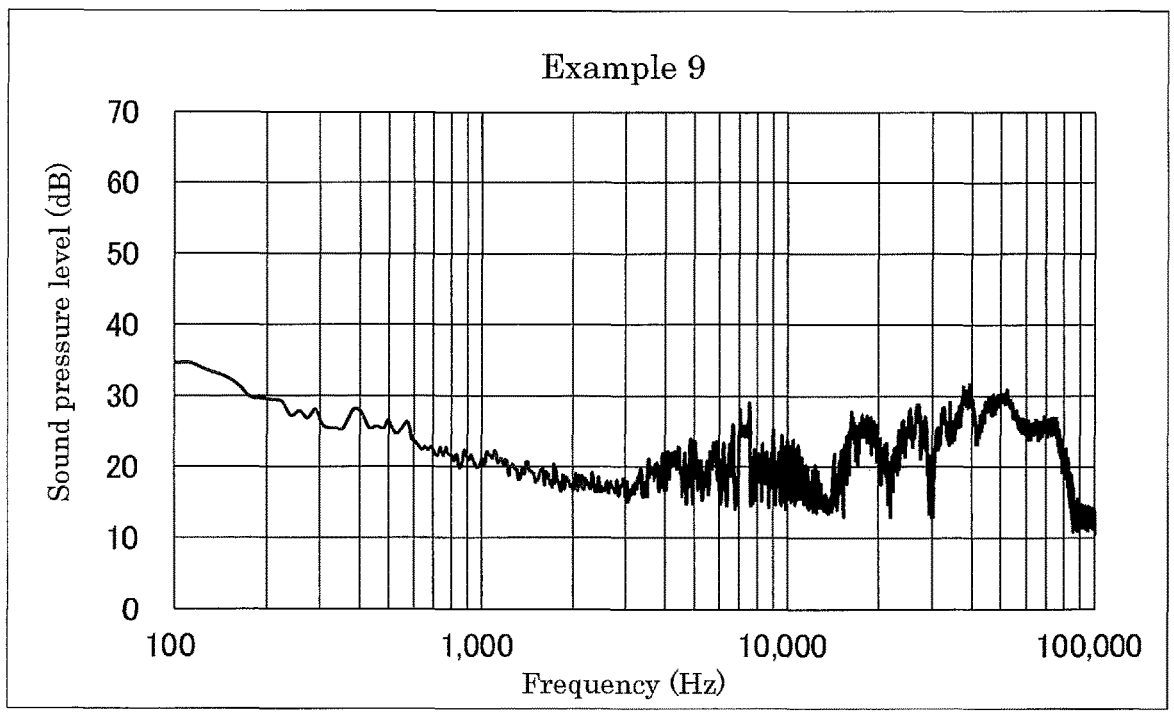
FIG. 20 is a graph showing the frequency characteristics of a sample of Example 9 in terms of sound pressure level.
Figure 21:
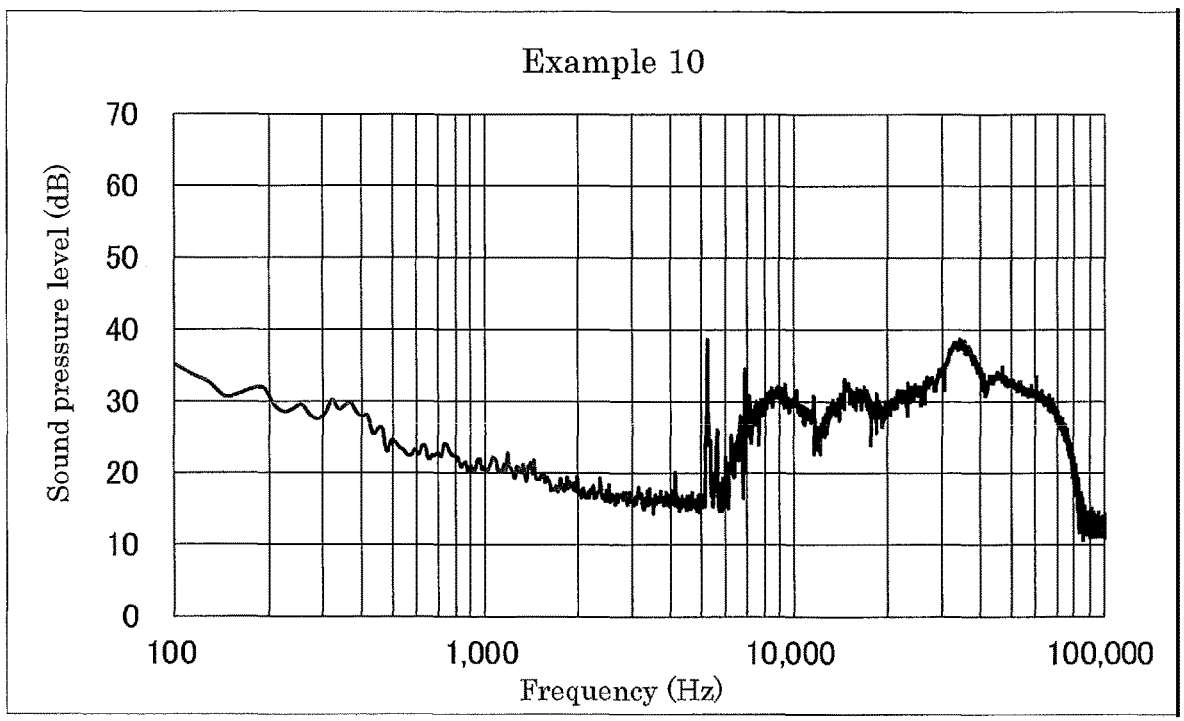
FIG. 21 is a graph showing the frequency characteristics of a sample of Example 10 in terms of sound pressure level.
Figure 22:
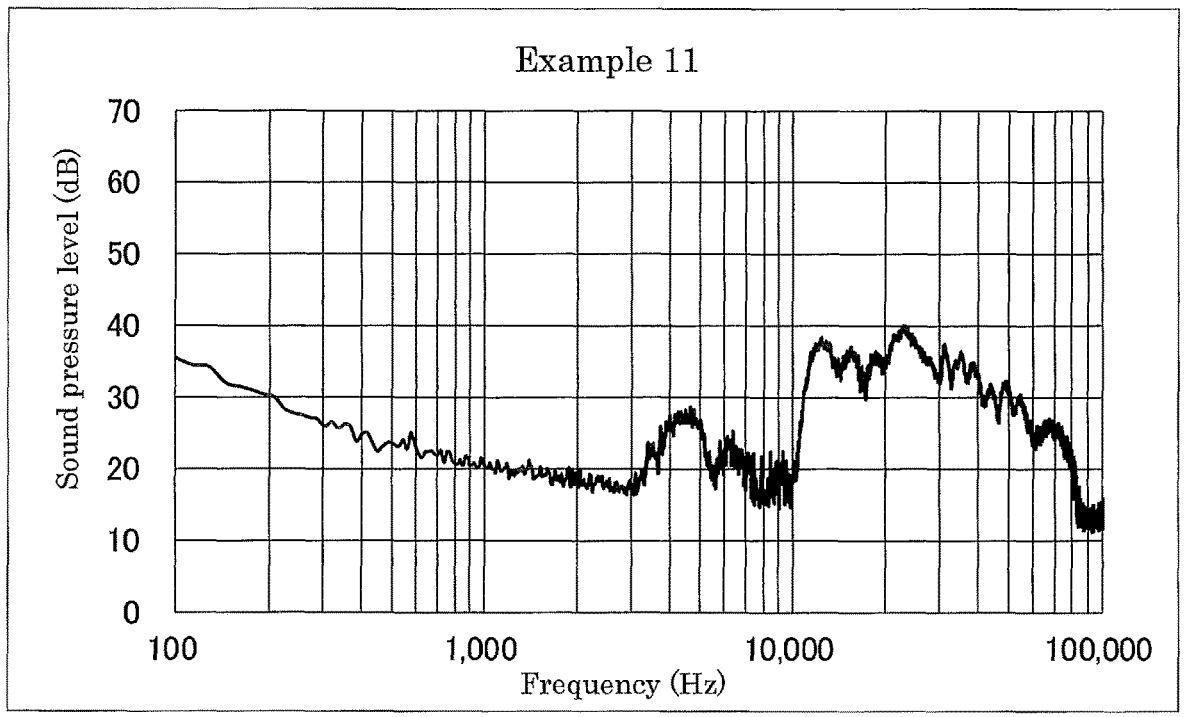
FIG. 22 is a graph showing the frequency characteristics of a sample of Example 11 in terms of sound pressure level.
Figure 23:
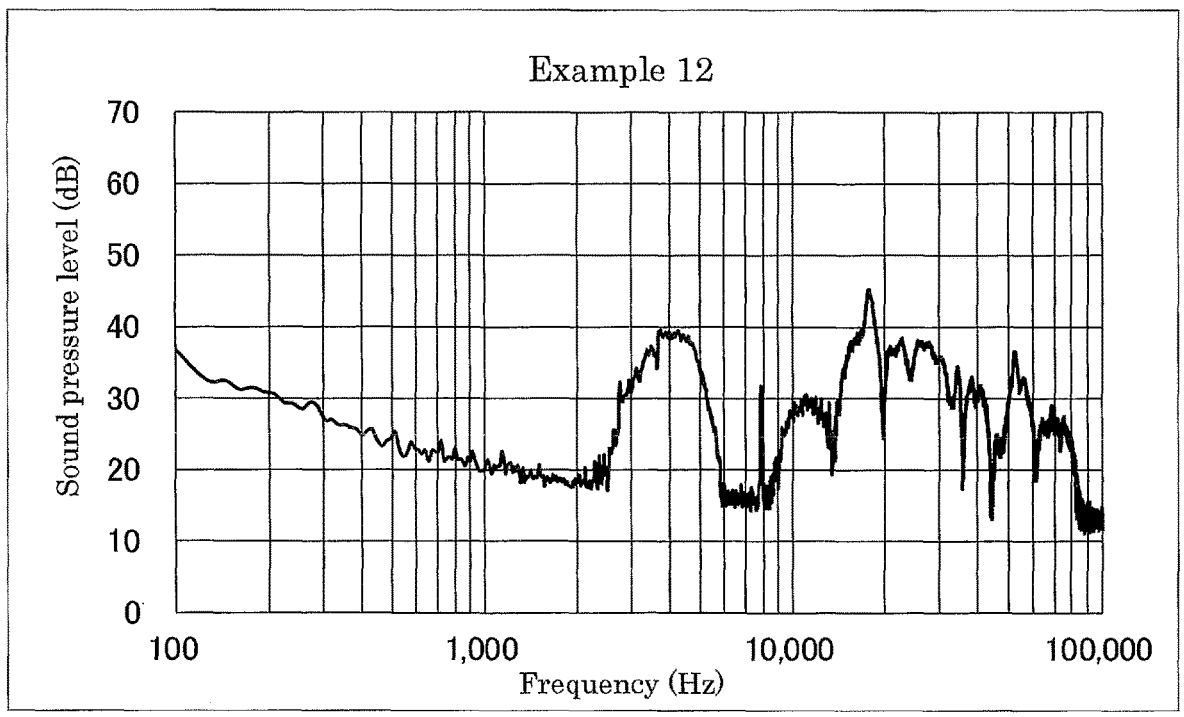
FIG. 23 is a graph showing the frequency characteristics of a sample of Example 12 in terms of sound pressure level.
Figure 24:
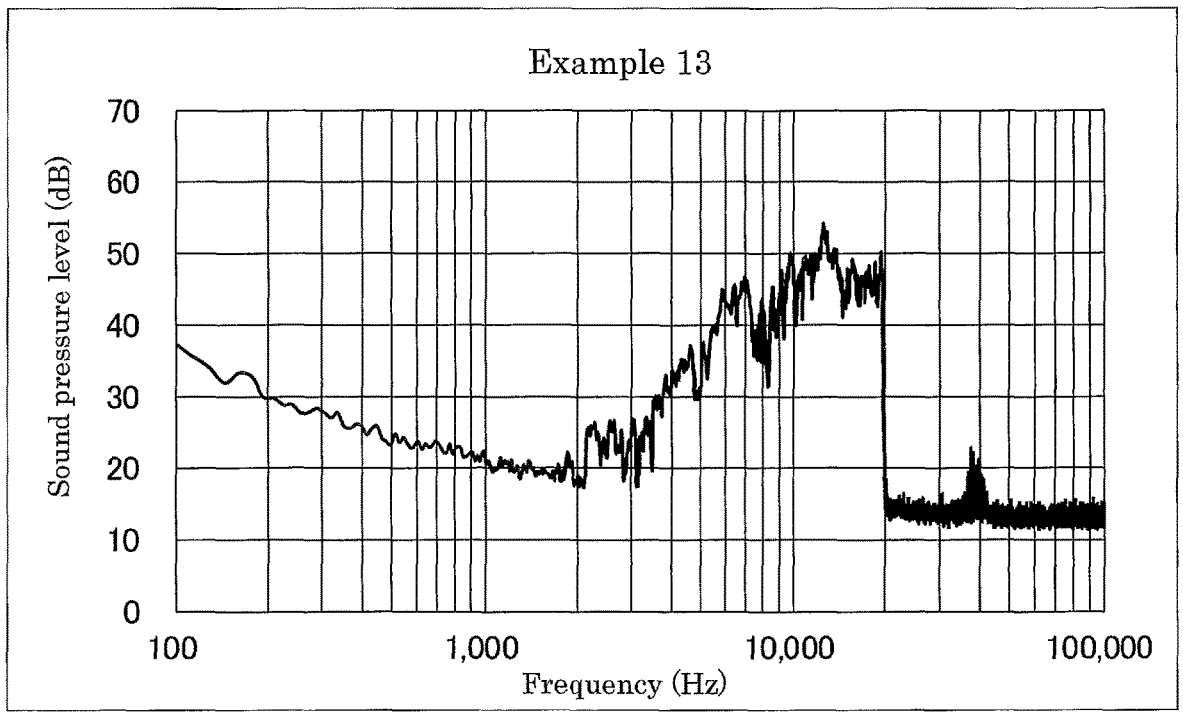
FIG. 24 is a graph showing the frequency characteristics of a sample of Example 13 in terms of sound pressure level.
Figure 25:
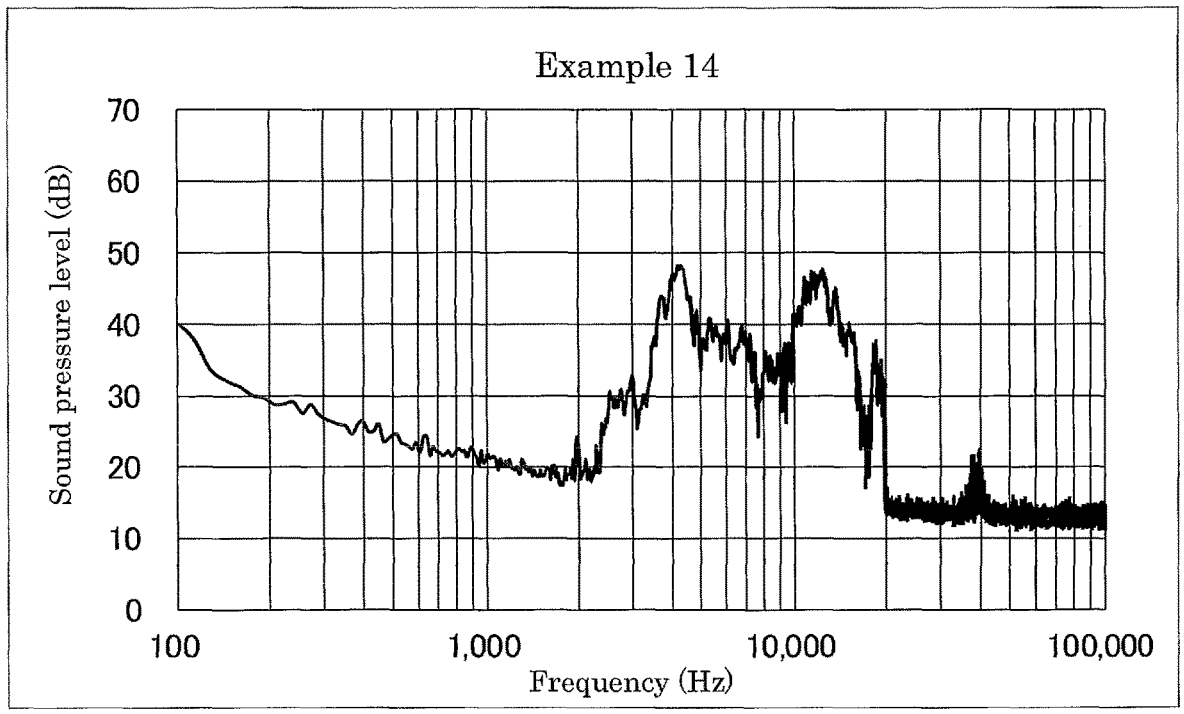
FIG. 25 is a graph showing the frequency characteristics of a sample of Example 14 in terms of sound pressure level.
Figure 26:
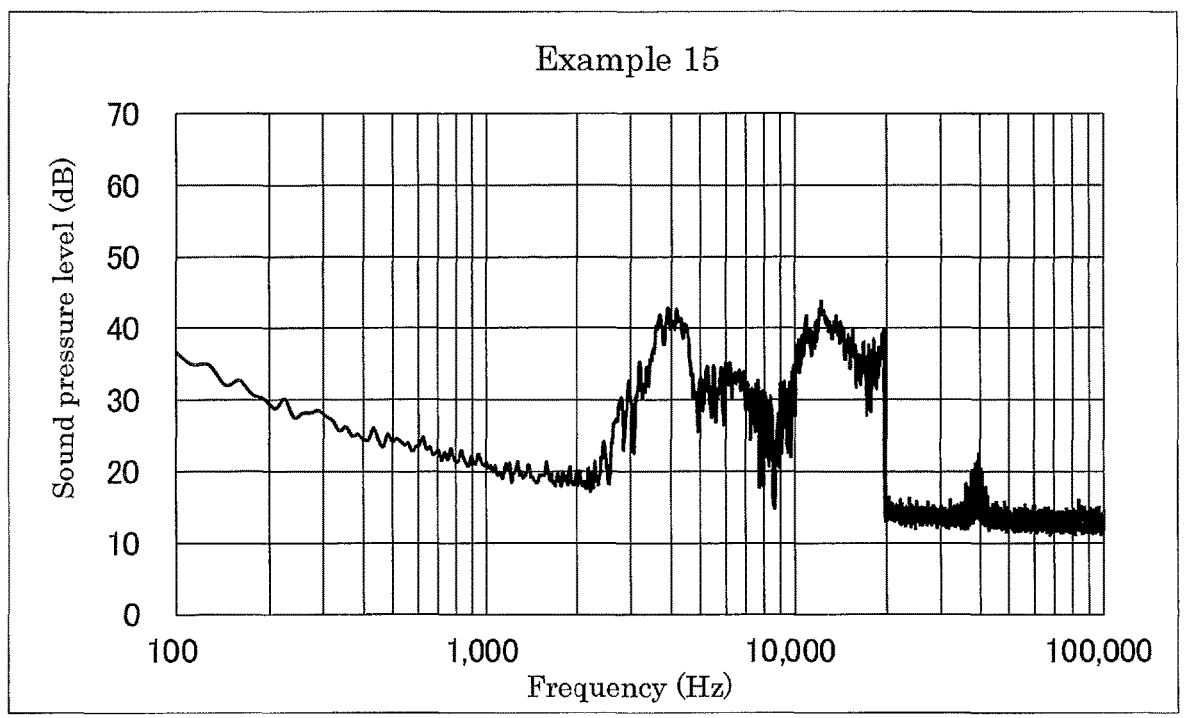
FIG. 26 is a graph showing the frequency characteristics of a sample of Example 15 in terms of sound pressure level.
Figure 27:
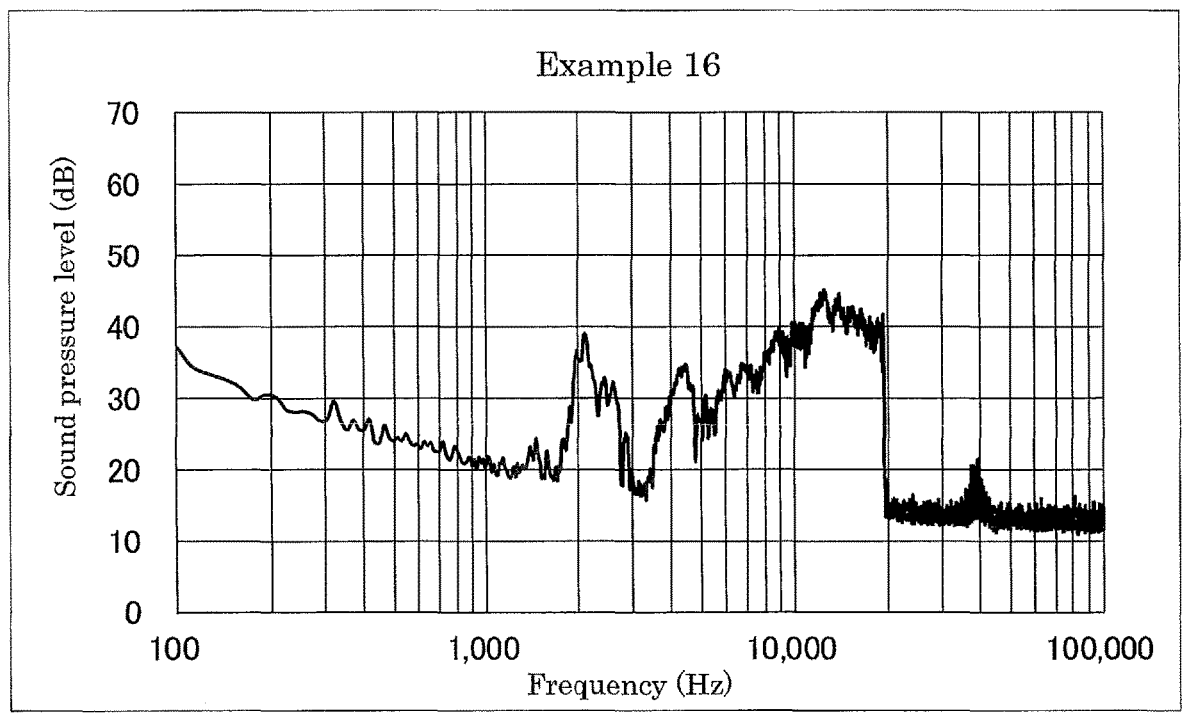
FIG. 27 is a graph showing the frequency characteristics of a sample of Example 16 in terms of sound pressure level.
Figure 28:
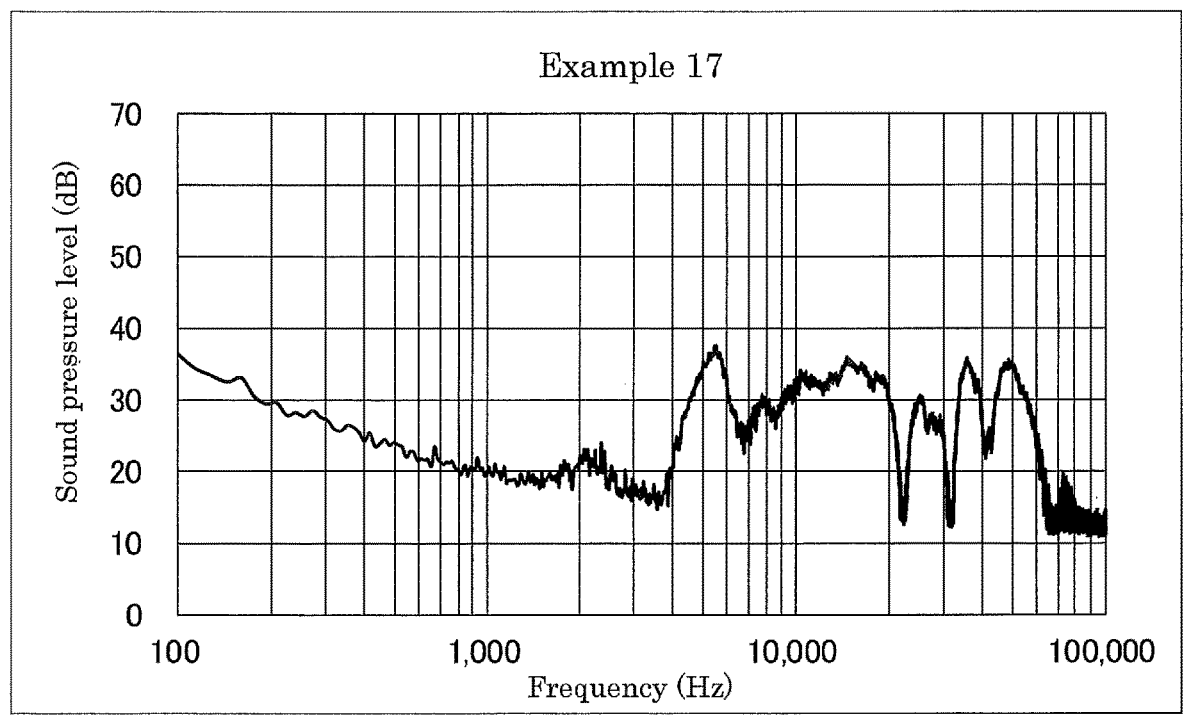
FIG. 28 is a graph showing the frequency characteristics of a sample of Example 17 in terms of sound pressure level.
Figure 29:
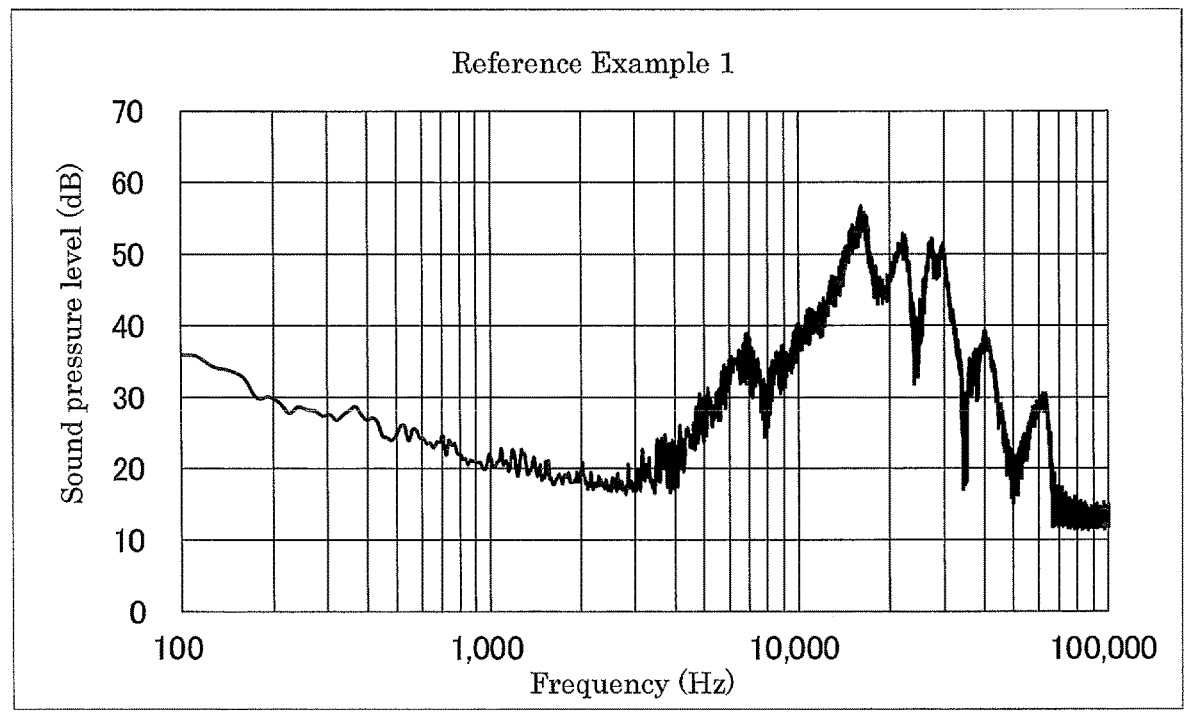
FIG. 29 is a graph showing the frequency characteristics of a sample of Reference Example 1 in terms of sound pressure level.
Figure 30:
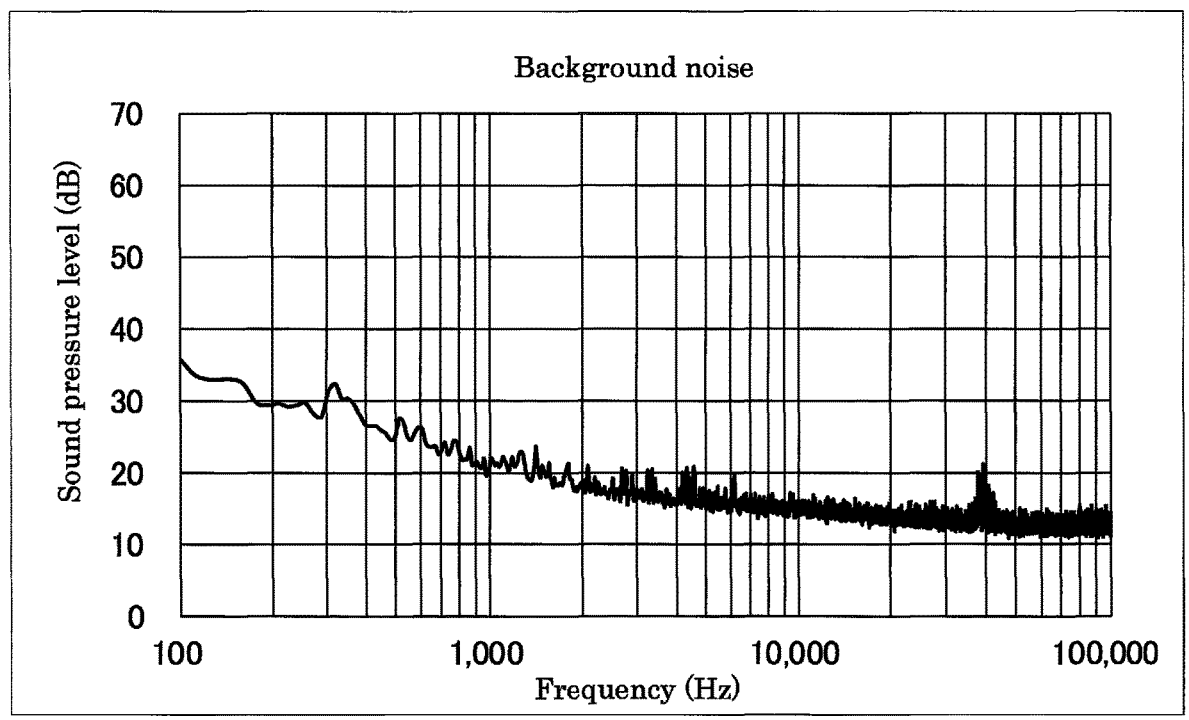
FIG. 30 is a graph showing the frequency characteristics of background noise in terms of sound pressure level.

The evaluation results for Examples 1 to 17 and Reference Example 1 are shown in FIG. 10A to FIG. 29. The frequency characteristics of background noise in terms of sound pressure level are shown in FIG. 30. E 1 to E17 in FIG. 11 correspond to Examples 1 to 17.

[Piezoelectric Film-Supporting Structure and Degree of Freedom of Vibration]

FIG. 3 is referred back to for an exemplary piezoelectric speaker-supporting structure of the present invention. In the piezoelectric speaker 10, the entire surface of the piezoelectric film 35 is fixed to the support 80 with the pressure-sensitive adhesive layers 51 and 52 and the interposed layer 40 therebetween.

Figure 31:
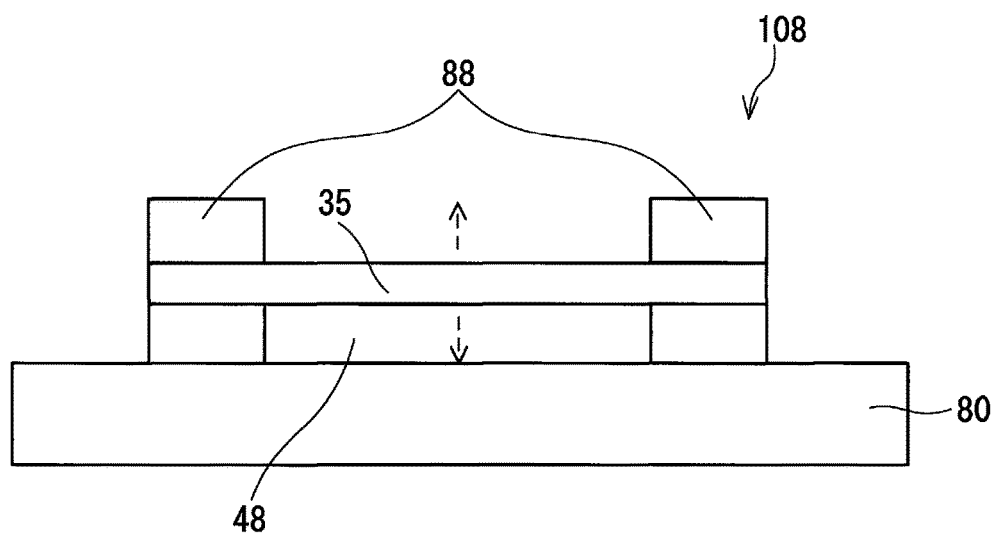
FIG. 31 illustrates a supporting structure of a piezoelectric film.

It is also conceivable that a portion of the piezoelectric film 35 is supported to be spaced away from the support 80 in order to prevent the support 80 from hindering vibration of the piezoelectric film 35. An exemplary supporting structure based on this design concept is shown in FIG. 31. In a hypothetical piezoelectric speaker 108 shown in FIG. 31, a frame 88 supports a peripheral portion of the piezoelectric film 35 at a position distant from the support 80.

It is easy to ensure a sufficient volume of sound emitted from a piezoelectric film already curved and fixed in one direction. Therefore, it is conceivable that, for example, in the piezoelectric speaker 108, a nonuniformly thick interposition having a convex upper surface is disposed in a space 48 surrounded by the piezoelectric film 35, the frame 88, and the support 80 and a central portion of the piezoelectric film 35 is pushed upward. However, such an interposition is not joined to the piezoelectric film 35 so as not to hinder vibration of the piezoelectric film 35. Therefore, even with the interposition disposed in the space 48, it is only the frame 88 that supports the piezoelectric film 35 so as to determine vibration of the piezoelectric film 35.

As described above, the piezoelectric speaker 108 shown in FIG. 31 employs the supporting structure locally supporting the piezoelectric film 35. On the other hand, as shown in FIG. 3, the piezoelectric film 35 of the piezoelectric speaker 10 is not supported at a particular portion. Unexpectedly, the piezoelectric speaker 10 exhibits practical acoustic characteristics in spite of the fact that the entire surface of the piezoelectric film 35 is fixed to the support 80. Specifically, in the piezoelectric speaker 10, even a peripheral portion of the piezoelectric film 35 possibly vibrates up and down. The piezoelectric film 35 can vibrate up and down as a whole. Therefore, compared to the piezoelectric speaker 108, the piezoelectric speaker 10 has a higher degree of freedom of vibration and is relatively advantageous in achieving good sound emission characteristics.

The invention claimed is:

1. A piezoelectric speaker-forming laminate comprising:
   a piezoelectric film;
   a pressure-sensitive adhesive face;
   an interposed layer being a porous body layer and/or a resin layer disposed between the piezoelectric film and the pressure-sensitive adhesive face; and
   a release layer joined to the pressure-sensitive adhesive face, wherein
   the pressure-sensitive adhesive face is disposed in such a manner that at least a portion of the piezoelectric film overlaps the pressure-sensitive adhesive face when the piezoelectric film is viewed in plan, and
   the piezoelectric film and the interposed layer are allowed to be fixed to a support as a piezoelectric speaker or a portion of a piezoelectric speaker by sticking the pressure-sensitive adhesive face from which the release layer has been removed to the support.

2. The piezoelectric speaker-forming laminate according to claim 1, wherein the pressure-sensitive adhesive face is disposed on a region accounting for 50% or more of the area of the piezoelectric film when the piezoelectric film is viewed in plan.

3. The piezoelectric speaker-forming laminate according to claim 1, wherein the piezoelectric film, the interposed layer, and the release layer each have a substantially uniform thickness.

4. The piezoelectric speaker-forming laminate according to claim 3, having:
   the shape of a band-like body; and
   the form of a wound body wound in a longitudinal direction of the band-like body.

5. The piezoelectric speaker-forming laminate according to claim 1, wherein
   a piezoelectric body of the piezoelectric film is a resin film, and
   the interposed layer is a resin layer not functioning as a piezoelectric film.

6. The piezoelectric speaker-forming laminate according to claim 1, wherein 50% or more of a principal surface of the piezoelectric speaker-forming laminate, the principal surface being opposite to the release layer, is composed of the piezoelectric film.

7. The piezoelectric speaker-forming laminate according to claim 1, wherein the interposed layer in an uncompressed state has a thickness of 0.1 mm to 30 mm.

8. The piezoelectric speaker-forming laminate according to claim 1, wherein the interposed layer is an ethylene propylene rubber foam layer.

9. The piezoelectric speaker-forming laminate according to claim 1, wherein layers located between the piezoelectric film and the pressure-sensitive adhesive face and adjacent to each other are joined together, the location between the piezoelectric film and the pressure-sensitive adhesive face including the piezoelectric film and the pressure-sensitive adhesive face.

* * * * *